(12) United States Patent
Lee et al.

(10) Patent No.: US 12,200,930 B2
(45) Date of Patent: Jan. 14, 2025

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Seungmin Lee, Seoul (KR); Junhyoung Kim, Seoul (KR); Kangmin Kim, Hwaseong-si (KR); Byungkwan You, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 609 days.

(21) Appl. No.: 17/465,412

(22) Filed: Sep. 2, 2021

(65) Prior Publication Data

US 2022/0173120 A1 Jun. 2, 2022

(30) Foreign Application Priority Data

Dec. 1, 2020 (KR) ........................ 10-2020-0165657

(51) Int. Cl.
| | | |
|---|---|---|
| *H10B 43/27* | (2023.01) | |
| *H01L 23/522* | (2006.01) | |
| *H01L 23/528* | (2006.01) | |
| *H10B 41/10* | (2023.01) | |
| *H10B 41/27* | (2023.01) | |

(Continued)

(52) U.S. Cl.
CPC ......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ...... H10B 41/50; H10B 43/50; H01L 23/5283
See application file for complete search history.

(56) References Cited

U.S. PATENT DOCUMENTS

2017/0256588 A1\* 9/2017 Fukuda ............... H01L 29/7926
2018/0174960 A1\* 6/2018 Smith .................... H10B 43/27
(Continued)

FOREIGN PATENT DOCUMENTS

KR 10-2022-0003359 1/2022

*Primary Examiner* — Alia Sabur
(74) *Attorney, Agent, or Firm* — F. CHAU & ASSOCIATES, LLC

(57) ABSTRACT

A semiconductor device includes: a substrate that includes a first region and a second region; gate electrodes stacked on the first region in a first direction, extend by different lengths in a second direction on the second region, and respectively including a pad region having an upper surface that is upwardly exposed in the second region; interlayer insulating layers alternately stacked with the gate electrodes; channel structures that extend in the first direction and penetrate through the gate electrodes; plug insulating layers alternately disposed with the interlayer insulating layers and parallel to the gate electrodes below the pad region; and contact plugs that extend in the first direction and respectively penetrate through the pad region and the plug insulating layers below the pad region. In each of the gate electrodes, the pad region has physical properties that differ from physical properties of regions other than the pad region.

18 Claims, 30 Drawing Sheets

(51) Int. Cl.
*H10B 41/35* (2023.01)
*H10B 41/40* (2023.01)
*H10B 43/10* (2023.01)
*H10B 43/35* (2023.01)
*H10B 43/40* (2023.01)

(56) References Cited

U.S. PATENT DOCUMENTS

| | | | |
|---|---|---|---|
| 2018/0350879 A1* | 12/2018 | Sel | H01L 21/76831 |
| 2019/0067182 A1* | 2/2019 | Lee | H01L 21/762 |
| 2019/0252404 A1* | 8/2019 | Kaminaga | H10B 43/27 |
| 2019/0326316 A1* | 10/2019 | Son | H01L 23/535 |
| 2019/0363006 A1* | 11/2019 | Min | H01L 21/3105 |
| 2020/0350249 A1* | 11/2020 | Kim | H10B 43/27 |
| 2021/0098367 A1* | 4/2021 | Lee | H10B 43/50 |
| 2021/0296339 A1* | 9/2021 | Yamamoto | H10B 43/50 |
| 2022/0005759 A1 | 1/2022 | Lee et al. | |
| 2022/0093635 A1* | 3/2022 | Lee | H01L 23/5283 |

* cited by examiner

SEMICONDUCTOR DEVICES AND DATA STORAGE SYSTEMS INCLUDING THE SAME

CROSS-REFERENCE TO RELATED APPLICATION(S)

This application claims priority under 35 U.S.C. § 119 from Korean Patent Application No. 10-2020-0165657, filed on Dec. 1, 2020 in the Korean Intellectual Property Office, the contents of which are herein incorporated by reference in their entirety.

BACKGROUND

Embodiments of the present disclosure are directed to semiconductor devices and data storage systems that include the same.

In a data storage system that requires data storage, there is an increasing demand for a semiconductor device that can store high-capacity data. Accordingly, methods of increasing data storage capacity of a semiconductor device have been studied. For example, a semiconductor device that includes three-dimensionally arranged memory cells, rather than two-dimensionally arranged memory cells, has been proposed as a way of increasing data storage capacity of a semiconductor device.

SUMMARY

Embodiments provide a semiconductor device that has improved reliability.

Embodiments provide a data storage system that includes a semiconductor device that has improved reliability.

According to an embodiment, a semiconductor device includes: a first structure that includes a first substrate and circuit elements on the first substrate; and a second structure disposed on the first structure. The second structure includes: a second substrate that includes a first region and a second region; gate electrodes spaced apart from each other and stacked on the first region in a first direction, where the gate electrodes extend by different lengths in a second direction on the second region, and respectively include a pad region having an upper surface that is upwardly exposed in the second region; interlayer insulating layers alternately stacked with the gate electrodes; channel structures that extend in the first direction, penetrate through the gate electrodes, and respectively include a channel layer; contact plugs that extend in the first direction toward the second substrate and penetrate through the pad region; and plug insulating layers alternately disposed below the pad region with the interlayer insulating layers where the plug insulating layers surround each of the contact plugs. Each of the gate electrodes has a decreased thickness in the pad region.

According to an embodiment, a semiconductor device includes: a substrate that includes a first region and a second region; gate electrodes spaced apart from each other and stacked on the first region in a first direction, where the gate electrodes extend by different lengths in a second direction on the second region, and respectively include a pad region having an upper surface in the second region that is upwardly exposed; interlayer insulating layers alternately stacked with the gate electrodes; channel structures that extend in the first direction and penetrate through the gate electrodes, where the channel structures respectively include a channel layer; plug insulating layers alternately disposed with the interlayer insulating layers and parallel to the gate electrodes below the pad regions; and contact plugs that extend in the first direction and respectively penetrate through the pad region and the plug insulating layers below the pad regions, where the contact plugs have lower ends disposed in the substrate. In each of the gate electrodes, the pad region has physical properties that differ from physical properties of a region other than the pad region.

According to an embodiment, a data storage system includes: a semiconductor storage device that includes a first substrate; circuit elements on the first substrate; a second substrate disposed above the circuit elements and that includes a first region and a second region; gate electrodes spaced apart from each other and stacked on the first region in a first direction, where the gate electrodes extend by different lengths in a second direction on the second region, and respectively include a pad region in the second region that has an upper surface that is upwardly exposed; interlayer insulating layers alternately stacked with the gate electrodes; channel structures that extend in the first direction and penetrate through the gate electrodes, where the channel structures respectively include a channel layer; contact plugs that extend in the first direction toward the second substrate and respectively penetrate through the pad region; plug insulating layers alternately disposed with the interlayer insulating layers below the pad region and that surround each of the contact plugs; and an input/output pad electrically connected to the circuit elements; and a controller that is electrically connected to the semiconductor storage device through the input/output pad and that control the semiconductor storage device. Each of the gate electrodes in the semiconductor storage device has a decreased thickness in the pad region.

DETAILED DESCRIPTION

Hereinafter, embodiments will be described with reference to the accompanying drawings.

Figure 1:
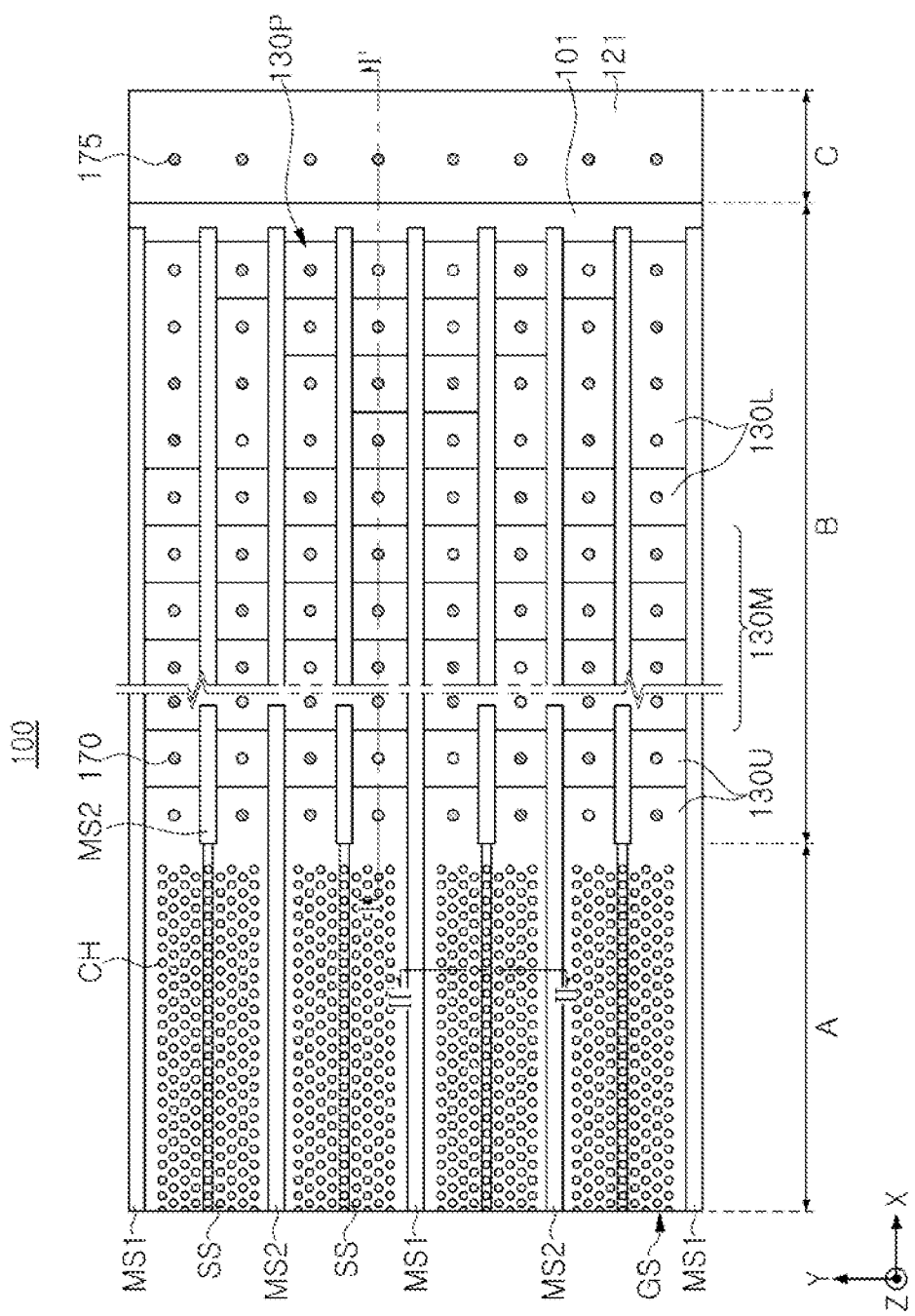
FIG. 1 is a schematic plan view of a semiconductor device according to embodiments.

FIG. 1 is a schematic plan view of a semiconductor device according to embodiments.

Figure 2A:
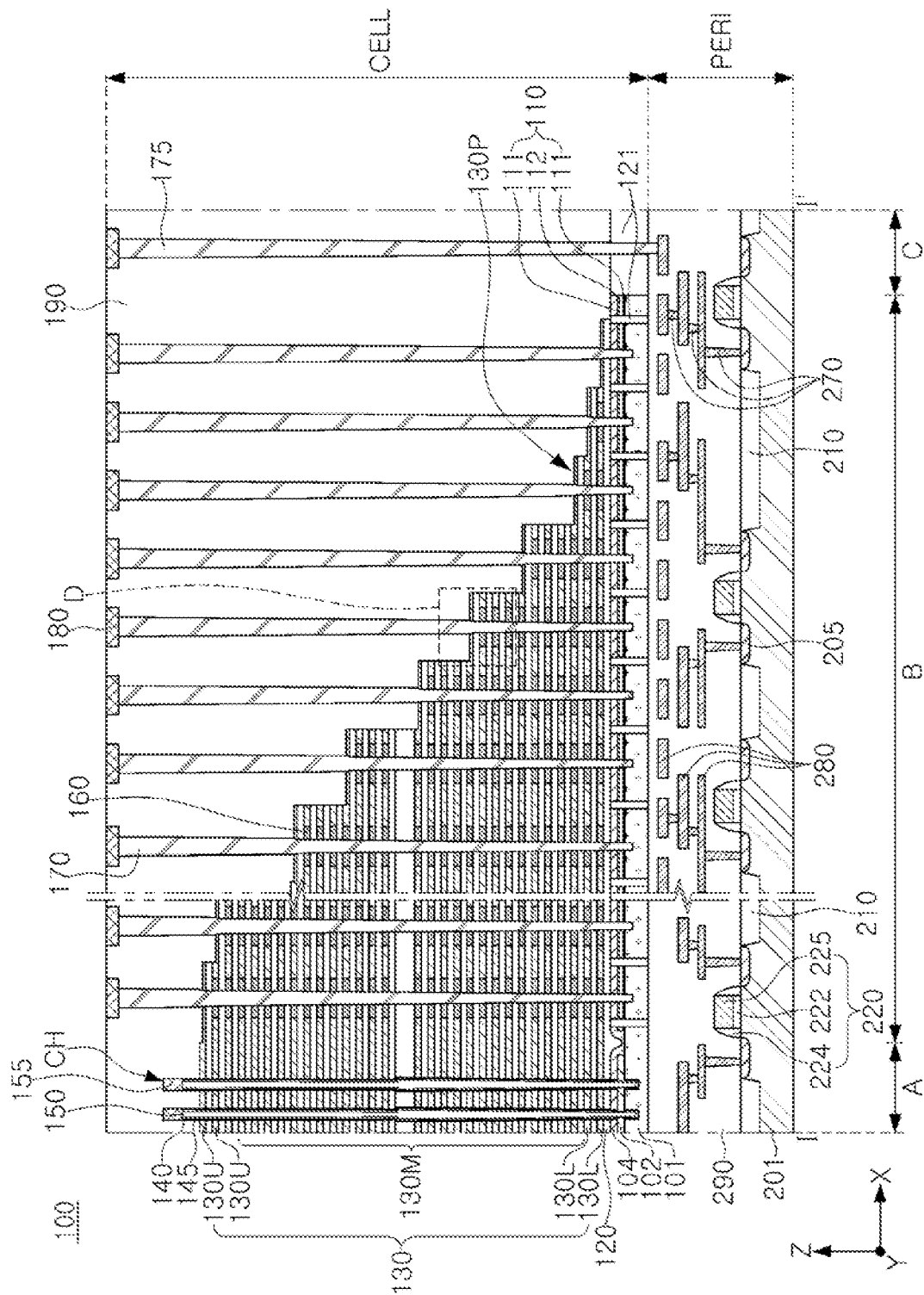
FIGS. 2A and 2B are schematic cross-sectional views of a semiconductor device according to embodiments.
Figure 2B:
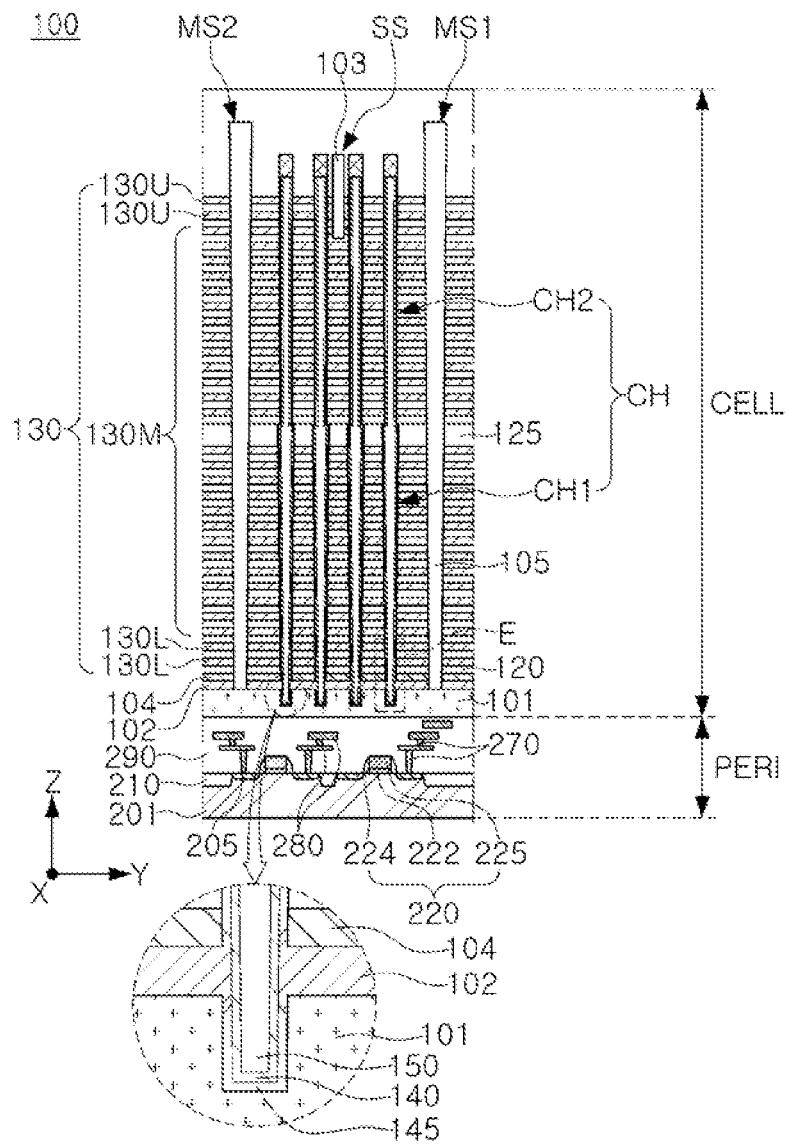

FIGS. 2A and 2B are schematic cross-sectional views of a semiconductor device according to embodiments. FIG. 2A is a cross-sectional view taken along line I-I' of FIG. 1, and FIG. 2B is a cross-sectional view taken along line II-II' of FIG. 1.

Figure 3:
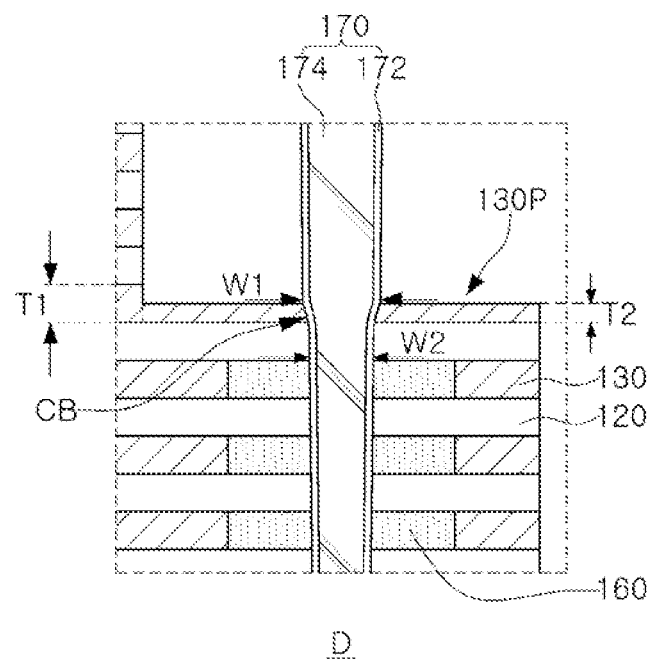
FIG. 3 is a partially enlarged view of a region 'D' of FIG. 2A, according to embodiments.

FIG. 3 is a partially enlarged view of a selected region of a semiconductor device according to embodiments. FIG. 3 illustrates an enlarged view of region "D" of FIG. 2A.

Referring to FIGS. 1 to 2B, according to an embodiment, a semiconductor device 100 includes a peripheral circuit structure PERI that includes a first substrate 201 and a memory cell structure CELL that includes a second substrate 101. The memory cell structure CELL is disposed above the peripheral circuit structure PERI. However, embodiments are not limited thereto, and in other embodiments, the memory cell structure CELL is disposed below the peripheral circuit structure PERI.

According to an embodiment, the peripheral circuit structure PERI includes the first substrate 201, source/drain regions 205 and isolation layers 210 in the first substrate 201, and circuit elements 220, circuit contact plugs 270, circuit interconnection lines 280, and a peripheral insulating layer 290 disposed on the first substrate 201.

According to an embodiment, the first substrate 201 has an upper surface that extends in an X direction and a Y direction, where the Y direction crosses the X direction. An active region is defined in the first substrate 201 by the isolation layers 210. Source/drain regions 205 that include impurities are disposed in a portion of the active region. The first substrate 201 includes a semiconductor material such as a group IV semiconductor, a group III-V compound semiconductor, or a group II-VI compound semiconductor. The first substrate 201 may be provided as a bulk wafer or an epitaxial layer.

According to an embodiment, the circuit elements 220 include a planar transistor. Each of the circuit elements 220 includes a circuit gate dielectric layer 222, a spacer layer 224, and a circuit gate electrode 225. Source/drain regions 205 are disposed in the first substrate 201 on opposite sides of the circuit gate electrode 225.

According to an embodiment, the peripheral insulating layer 290 is disposed on the circuit element 220 and the first substrate 201. The circuit contact plugs 270 connect to the source/drain regions 205 through the peripheral insulating layer 290. An electrical signal can be applied to the circuit element 220 by the circuit contact plugs 270. The circuit contact plugs 270 are also connected to the circuit gate electrode 225. The circuit interconnection lines 280 connect to the circuit contact plugs 270 and are disposed in a plurality of layers.

According to an embodiment, the memory cell structure CELL includes the second substrate 101, which has a first region A and a second region B, gate electrodes 130 stacked on the second substrate 101, interlayer insulating layers 120 stacked alternately with the gate electrodes 130, first and second separation regions MS1 and MS2 that extend through the stack of the gate electrodes 130, channel structures CH that penetrate through the stack of the gate electrodes 130, and contact plugs 170 that extend through the gate electrodes 130 in the second region B. The memory cell structure CELL further includes a first horizontal conductive layer 102 on the first region A of the second substrate 101, a horizontal insulating layer 110 on the second region of the second substrate 101 and that is parallel to the first horizontal conductive layer 102, a second horizontal conductive layer 104 on the first horizontal conductive layer 102 and the horizontal insulating layer 110, a substrate insulating layer 121 that separates the second substrate 101, upper separation regions SS that penetrates through a portion of the stack of the gate electrodes 130, plug insulating layers 160 that surround the contact plugs 170, cell interconnection lines 180, and a cell insulating layer 190. The memory cell region CELL further includes a third region C outside the second substrate 101, and a through-wiring structure such as a through-via 175 is disposed in the third region C that connects the memory cell region CELL and the peripheral circuit region PERI to each other.

According to an embodiment, the first region A of the second substrate 101 is where the gate electrodes 130 are vertically stacked and the channel structures CH are disposed, and is where memory cells are disposed. The second region B is where the gate electrodes 130 extend by different lengths, and is where the memory cells are electrically connected to the peripheral circuit region PERI. The second region B is located on at least one end of the first region A in at least one direction, such as an X direction.

According to an embodiment, the second substrate 101 has an upper surface that extends in the X direction and the Y direction. The second substrate 101 includes a semiconductor material such as a group IV semiconductor, a group III-V compound semiconductor, or a group II-VI compound semiconductor. For example, the group IV semiconductors include silicon, germanium, or silicon-germanium. The second substrate 101 further includes impurities. The second substrate 101 may be a polycrystalline semiconductor layer, such as a polycrystalline silicon layer, or an epitaxial layer.

According to an embodiment, the first and second horizontal conductive layers 102 and 104 are sequentially stacked on an upper surface of the first region A of the second substrate 101. The first horizontal conductive layer 102 does not extend into the second region B of the second substrate 101, while the second horizontal conductive layer 104 does extend into the second region B.

According to an embodiment, the first horizontal conductive layer 102 functions as a portion of a common source line of the semiconductor device 100. For example, the first horizontal conductive layer 102 functions as a common source line together with the second substrate 101. As illustrated in the enlarged view of FIG. 2B, the first horizontal conductive layer 102 is directly connected to a channel layer 140 around the channel layer 140.

According to an embodiment, the second horizontal conductive layer 104 is in contact with the second substrate 101 in regions in which the first horizontal conductive layer 102 and the horizontal insulating layer 110 are not disposed. In these regions, the second horizontal conductive layer 104 covers an end portion of the first horizontal conductive layer 102 or the horizontal insulating layer 110 and is bent to extend onto the second substrate 101.

According to an embodiment, the first and second horizontal conductive layers 102 and 104 include a semiconductor material. For example, both the first and second horizontal conductive layers 102 and 104 include polycrystalline silicon. In this case, at least the first horizontal conductive layer 102 is a doped layer, and the second horizontal conductive layer 104 may be a doped layer or a layer that includes impurities that diffused from the first horizontal conductive layer 102. However, embodiments are not limited thereto, and in other embodiments, the second horizontal conductive layer 104 is replaced with an insulating layer.

According to an embodiment, the horizontal insulating layer 110 is disposed on the second substrate 101 and is parallel to the first horizontal conductive layer 102 in at least a portion of the second region B. The horizontal insulating layer 110 includes first and second horizontal insulating layers 111 and 112 alternately stacked on the second region B of the second substrate 101. The horizontal insulating layer 110 is that which remains after a portion of the horizontal insulating layer 110 is replaced with the first horizontal conductive layer 102 in a process of fabricating the semiconductor device 100.

According to an embodiment, the horizontal insulating layer 110 includes at least one of a silicon oxide, a silicon nitride, a silicon carbide, or a silicon oxynitride. The first horizontal insulating layers 111 and the second horizontal insulating layers 112 include different insulating materials. For example, the first horizontal insulating layers 111 is formed of the same material as the interlayer insulating layers 120, and the second horizontal insulating layer 112 is formed of a material that differs from a material of the interlayer insulating layers 120.

According to an embodiment, the substrate insulating layers 121 separate the second substrate 101, the horizontal insulating layer 110, and the second horizontal conductive layer 104 in the second region B of the second substrate 101. The substrate insulating layer 121 extends in a Z direction, and penetrates through the second substrate 101, the horizontal insulating layer 110, and the second horizontal conductive layer 104. The substrate insulating layers 121 separates region on the second substrate 101 that are connected to the contact plugs 170 from each other. For example, the substrate insulating layer 121 separates the second substrate 101 into a plurality of regions that are spaced apart from each other, where each region surrounds on of the contact plugs 170. Accordingly, contact plugs 170 connected to different gate electrodes 130 are electrically separated from each other. For example, the substrate insulating layer 121 has a predetermined width along a boundary of each of the first and second separation regions MS1 and MS2 illustrated in FIG. 1, and the predetermined width corresponds to a boundary of each of the gate electrodes 130. However, embodiments are not limited thereto, and in other embodiments, the substrate insulating layers 121 form a grid that extends in the X direction along the boundary of each of the first and second separation regions MS1 and MS2 and in the Y direction along the boundary of each of the gate electrodes.

According to an embodiment, the gate electrodes 130 are vertically stacked and spaced apart from each other on the second substrate 101 and form a stack structure. The gate electrodes 130 include lower gate electrodes 130L that constitute a gate of a ground selection transistor, memory gate electrodes 130M that constitute a plurality of memory cells, and upper gate electrodes 130U that constitute gates of string select transistors. The number of memory gate electrodes 130M is determined based on the capacity of the semiconductor device 100. According to embodiments, one to four or more upper and lower gate electrodes 130U and 130L are respectively provided, and the upper and lower gate electrodes 130U and 130L may have the same structure as the memory gate electrodes 130M or may have a structure that differs from a structure of the memory gate electrodes 130M. In embodiments, the gate electrodes 130 further include a gate electrode 130 disposed above the upper gate electrodes 130U and/or below the lower gate electrodes 130L and that constitutes an erase transistor used in an erase operation that uses a gate induced drain lowering (GIDL) phenomenon. Some of the gate electrodes 130, such as the memory gate electrodes 130M that are adjacent to the upper gate electrode 130U or the lower gate electrode 130L may be dummy gate electrodes.

According to embodiments, the gate electrodes 130 are vertically stacked and spaced apart from each other on the first region A, and extend from the first region A to the second region B by different lengths to form a staircase or step structure. As illustrated in FIG. 2A, the gate electrodes 130 form a step structure in the X direction. In embodiments, among at least some of the gate electrodes 130, such as two to six gate electrodes 130, constitute a single gate group that extend by the same length from the first region A to the second region B to form a step structure in the X direction between other gate groups. In this case, the gate electrodes 130 that constitute a single gate group have a step structure in the Y direction.

According to embodiments, due to the step structure, the gate electrodes 130 have regions in which the lower gate electrode 130 extends further into the second region B than the upper gate electrode 130, and are upwardly exposed by the interlayer insulating layers 120, and are referred to as pad regions 130P. In each of the gate electrodes 130, the pad region 130P includes an end portion in the X direction. The pad regions 130P correspond to a portion of an uppermost gate electrode 130 in each region, of the gate electrodes 130 that constitute the stack structure in the second region B of the second substrate 101. The gate electrodes 130 are connected to the contact plugs 170 in the pad regions 130P. In an embodiment, the gate electrodes 130 have a decreased thickness in the pad regions 130P. The thickness of each of the gate electrodes 130 decreases such that a lower surface level of each of the gate electrodes 130 is constant and an upper surface level of each of the gate electrodes 130 is lowered.

As illustrated in FIG. 3, according to embodiments, the gate electrodes 130 extend from the first region A to the second region B with a first thickness T1, and may have a second thickness T2 that is less than the first thickness T1 in the pad regions 130P, which is represented by dashed lines. The second thickness T2 ranges from about 50% to about 80% of the first thickness T1. According to embodiments, in the gate electrode 130, the pad region 130P and the other regions have different physical properties. For example, the pad region 130P has a doped region, and thus, may include impurities, unlike the other regions. The impurities include, for example, nitrogen (N), but are not limited thereto. For example, the physical properties of the pad region 130P differ from those of the other regions due to the doped region.

According to embodiments, the gate electrodes 130 separated from each other in the Y direction by a first separation region MS1 that extends in the X direction. The gate electrodes 130 between a pair of first separation regions MS1 constitute a single memory block, but a range of memory blocks is not limited thereto. Some of the gate electrodes 130, such as each of the memory gate electrodes 130M, may constitute a single layer within a single memory block.

According to embodiments, the gate electrodes 130 include a metallic material, such as tungsten (W). According to embodiments, the gate electrodes 130 may include polycrystalline silicon or a metal silicide. In other embodiments, the gate electrodes 130 further include a diffusion barrier. For example, the diffusion barrier includes one or more of a tungsten nitride (WN), a tantalum nitride (TaN), a titanium nitride (TiN), or combinations thereof.

According to embodiments, interlayer insulating layers 120 are disposed between the gate electrodes 130. Similar to the gate electrodes 130, the interlayer insulating layers 120 are spaced apart from each other in a Z direction that is perpendicular to an upper surface of the second substrate 101, and extend in the X direction. The interlayer insulating layers 120 include an insulating material such as a silicon oxide or a silicon nitride.

According to embodiments, the first and second separation regions MS1 and MS2 extend in the X direction through the gate electrodes 130. The first and second separation regions MS1 and MS2 are parallel to each other. The first and second separation regions MS1 and MS2 penetrate through the entire stack of gate electrodes 130 on the second substrate 101 to be connected to the second substrate 101. The first separation regions MS1 extend in the X direction as a single unbroken component from the first region A to the second region B, and the second separation regions MS2 intermittently extend between a pair of first separation regions MS1, or are disposed only in some regions, and includes components separated from each other in the X direction. However, in other embodiments, the arrangement order and number of the first and second separation regions MS1 and MS2 are not limited to those illustrated in FIG. 1.

As illustrated in FIG. 2B, according to embodiments, a separation insulating layer 105 is disposed in the first and second separation regions MS1 and MS2. A width of the separation insulating layer 105 decreased in a direction toward the second substrate 101 due to a high aspect ratio, but embodiments are not limited thereto, and in other embodiments, has a side surface perpendicular to the upper surface of the second substrate 101. In other embodiments, a conductive layer is further disposed in the separation insulating layer 105 in the first and second separation regions MS1 and MS2. In this case, the conductive layer may function as a common source line of the semiconductor device 100 or as a contact plug connected to the common source line.

As illustrated in FIG. 1, according to embodiments, the upper separation regions SS extend in the X direction in the first region A between the first separation regions MS1 and the second separation regions MS2. The upper separation regions SS penetrate through a portion of the gate electrodes 130 that include an uppermost gate electrode 130U. As illustrated in FIG. 2B, the upper separation regions SS separate a total of three gate electrodes 130, including the upper gate electrodes 130U, from each other in the Y direction. However, the number of gate electrodes 130 separated by the upper separation regions SS varies according to embodiments. The upper gate electrodes 130U that are separated by the upper separation regions SS constitute different string select lines. An upper separation insulating layer 103 is disposed in the upper separation regions SS. The upper separating insulating layer 103 includes an insulating material, such as a silicon oxide, a silicon nitride, or a silicon oxynitride.

As illustrated in FIG. 1, according to embodiments, the channel structures CH each constitute a single memory cell string, and are spaced apart from each other while forming rows and columns on the first region A. The channel structures CH may be disposed in a grid pattern, or may be disposed in a zigzag pattern in one direction. The channel structures CH have a columnar shape, and have an inclined side surface that narrows in a direction toward the second substrate 101, depending on an aspect ratio.

As illustrated in FIG. 2B, according to embodiments, the channel structures CH include first and second channel structures CH1 and CH2 that are vertically stacked. The channel structures CH include a first channel structures CH1 disposed therebelow and the second channel structures CH2 disposed thereabove that are connected to each other, and may have a bend in a side surface due to a difference in width in a connection region. The stacked-type channel structures CH stably form channel structures CH when the number of the stacked gate electrodes 130 is relatively high. However, the number of channel structures stacked in the Z direction varies according to embodiments.

As illustrated in the enlarged view of FIG. 2B, according to embodiments, the channel 5, layer 140 is disposed in each of the channel structures CH. In the channel structures CH, the channel layer 140 has an annular shape that surrounds a channel buried insulating layer 150. However, according to other embodiments, the channel layer 140 has a columnar shape, such as a cylindrical shape or a prismatic shape, without the channel buried insulating layer 150. The channel layer 140 is connected to the first horizontal conductive layer 102 in a lower portion of the channel layer 140. The channel layer 140 includes a semiconductor material such as doped or undoped polycrystalline silicon or single-crystalline silicon.

According to embodiments, a gate dielectric layer 145 is disposed between the gate electrodes 130 and the channel layer 140. The gate dielectric layer 145 includes a tunneling layer, a charge storage layer, and a blocking layer sequentially stacked from the channel layer 140. The tunneling layer tunnels charges to the charge storage layer and includes, for example, at least one of silicon oxide ($SiO_2$), silicon nitride ($Si_3N_4$), silicon oxynitride (SiON), or combinations thereof. The charge storage layer may be a charge trapping layer and/or a floating gate conductive layer. The blocking layer includes at least one of silicon oxide ($SiO_2$), silicon nitride ($Si_3N_4$), silicon oxynitride (SiON), a high-k dielectric material, or combinations thereof. In other embodiments, at least a portion of the gate dielectric layer 145 extend along the gate electrodes 130 in a horizontal direction.

According to embodiments, a channel pad 155 is disposed on an upper end of the upper second channel structure CH2. The channel pads 155 include, for example, doped polycrystalline silicon. However, in other embodiments, each of the first channel structure CH1 and the second channel structure CH2 includes a channel pad 155. In this case, the channel pad 155 of the first channel structure CH1 is connected to the channel layer 140 of the second channel structure CH2.

According to embodiments, the channel layer 140, the gate dielectric layer 145, and the channel buried insulating layer 150 are connected to each other between the first channel structure CH1 and the second channel structure CH2. An upper interlayer insulating layer 125 that is relatively thick is disposed between the first channel structure CH1 and the second channel structure CH2. However, embodiments are not limited thereto, and the shapes of the interlayer insulating layers 120 and the upper interlayer insulating layer 125 vary according to embodiments.

According to embodiments, in the second region B, the contact plugs 170 penetrate through uppermost gate electrodes 130 and plug insulating layers 160 disposed therebelow, and are connected to pad regions 130P. The contact plugs 170 penetrate through at least a portion of the cell region insulating layer 190 and are connected to each of the upwardly exposed pad regions 130P of the gate electrodes 130. Lower ends of the contact plugs 170 extend down to the second substrate 101. According to embodiments, the lower ends of the contact plugs 170 are disposed on the upper surface of the second substrate 101.

According to embodiments, the contact plugs 170 have a cylindrical shape whose width decreases in a direction toward the second substrate 101 due to an aspect ratio. As illustrated in FIG. 3, the contact plug 170 may have a bent side surface portion CB that is bent at an upper surface of the pad region 130P or inside the pad region 130P. Accordingly, a width of the contact plug 170 decreases. The bent side surface portion CB has a rounded obtuse angle in cross-section that is formed along a circumference of the contact plug 170. Accordingly, the width of the contact plug 170 discontinuously decreases above and below the bent side surface portion CB. The contact plug 170 has a first width W1 on an upper surface of the pad region 130P or a region adjacent to the pad region 130P, and a second width W2 that is less than the first width W1 on an upper surface of an uppermost plug insulating layer 160, or a region adjacent to the uppermost plug insulating layer 160.

According to embodiments, the contact plugs 170 include a barrier layer 172 that is disposed on sidewalls and bottom surfaces of contact holes in which the contact plugs 170 are disposed, and a contact conductive layer 174 on the barrier layer 172 that fills the contact holes. The barrier layer 172 includes at least one of, for example, titanium (Ti), titanium nitride (TiN), tantalum (Ta), or tantalum nitride (TaN). The contact conductive layer 174 includes at least one of, for example, tungsten (W), copper (Cu), aluminum (Al), or alloys thereof.

According to embodiments, the plug insulating layers 160 surround side surfaces of the contact plugs 170. The plug insulating layers 160 are surrounded by those gate electrodes 130 that are below the pad regions 130P of the gate electrodes 130. Internal side surfaces of the plug insulating layers 160 surround the contact plugs 170, and external side surfaces of the plug insulating layers 160 are surrounded by the gate electrodes 130. The contact plugs 170 are physically and electrically connected to a single gate electrode 130 by the plug insulating layers 160. The plug insulating layers 160 includes an insulating material, such as at least one of, a silicon oxide, a silicon nitride, or a silicon oxynitride.

According to embodiments, through-vias 175 are disposed in the third region C of the memory cell region CELL, which is an external region of the second substrate 101, and extend to the peripheral circuit region PERI through the cell insulating layer 190. The through-vias 175 connect the cell interconnection lines 180 of the memory cell region CELL to the circuit interconnection lines 280 of the peripheral circuit region PERI. The through-vias 175 include a conductive material, such as a metal such as tungsten (W), copper (Cu), or aluminum (Al), etc. The through-vias 175 are formed in the same process as the contact plugs 170, and thus, include the same material as the contact plugs 170.

According to embodiments, the cell interconnection lines 180 constitute an upper interconnection structure that is electrically connected to memory cells in the memory cell structure CELL. The cell interconnection lines 180 are connected to the contact plugs 170 and the through-vias 175, and are electrically connected to the gate electrodes 130 and the channel structures CH. However, the number of contact plugs and interconnection lines that constitute the upper interconnection structure varies according to embodiments. The cell interconnection lines 180 include a metal, such as tungsten (W), copper (Cu), or aluminum (Al), etc.

According to embodiments, the cell insulating layer 190 covers the second substrate 101, 5, the gate electrodes 130 on the second substrate 101, and the peripheral region insulating layer 290. The cell insulating layer 190 is formed of an insulating material, and includes a plurality of insulating layers.

Figure 4:
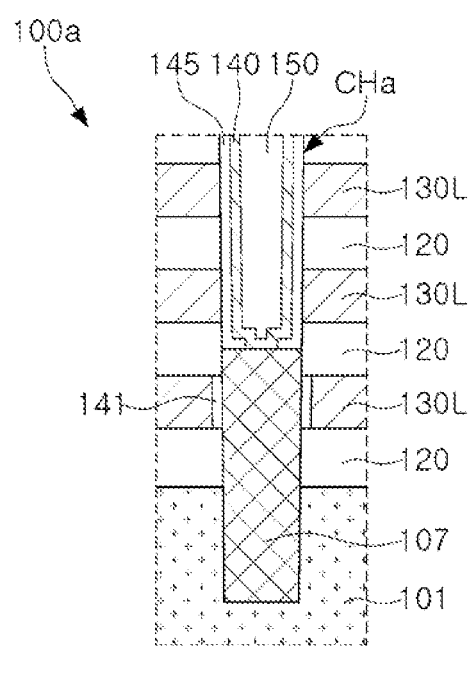
FIG. 4 is an enlarged view of a region 'E' of FIG. 2B, according to embodiments.

FIG. 4 is an enlarged view of a region of a semiconductor device according to embodiments. FIG. 4 is an enlarged view of a region E of FIG. 2B.

Referring to FIG. 4, according to embodiments, in a semiconductor device 100a, a memory cell structure CELL does not include first and second horizontal conductive layers 102 and 104 on a second substrate 101, unlike the embodiment of FIGS. 2A and 2B. In addition, a channel structure CHa further includes an epitaxial layer 107.

According to embodiments, the epitaxial layer 107 is disposed on the second substrate 101 at a lower end of the channel structure CHa, and on a side surface of at least one gate electrode 130. The epitaxial layer 107 is disposed in a recessed region of the second substrate 101. An upper surface of the epitaxial layer 107 is at a higher level than an upper surface of the lowermost gate electrode 130L and at a lower level than a lower surface of the gate electrode 130L on the lowermost gate electrode 130L, but embodiments are not limited thereto. The epitaxial layer 107 is connected to a channel layer 140 through an upper surface thereof. A gate insulating layer 141 is further disposed between lower gate electrodes 130L and the epitaxial layer 107, and is in contact with the epitaxial layer 107.

Figure 5A:
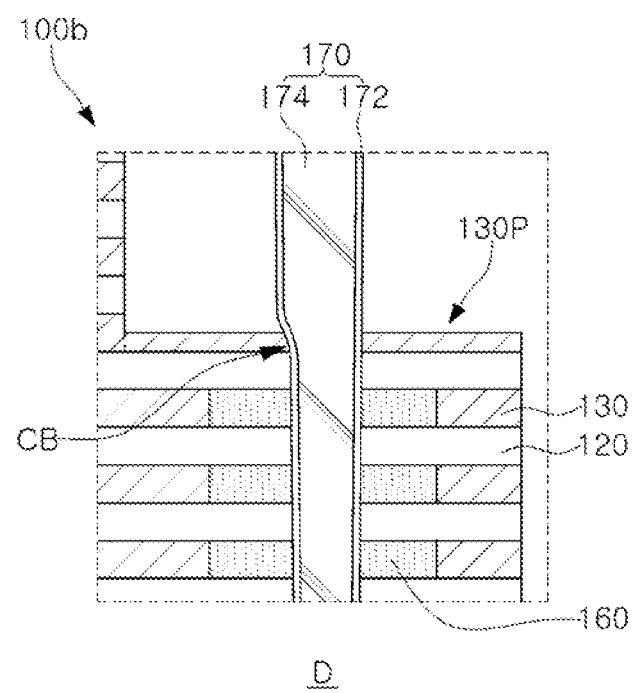
FIG. 5A is a partially enlarged view of a region 'D' of FIG. 2A.
Figure 5B:
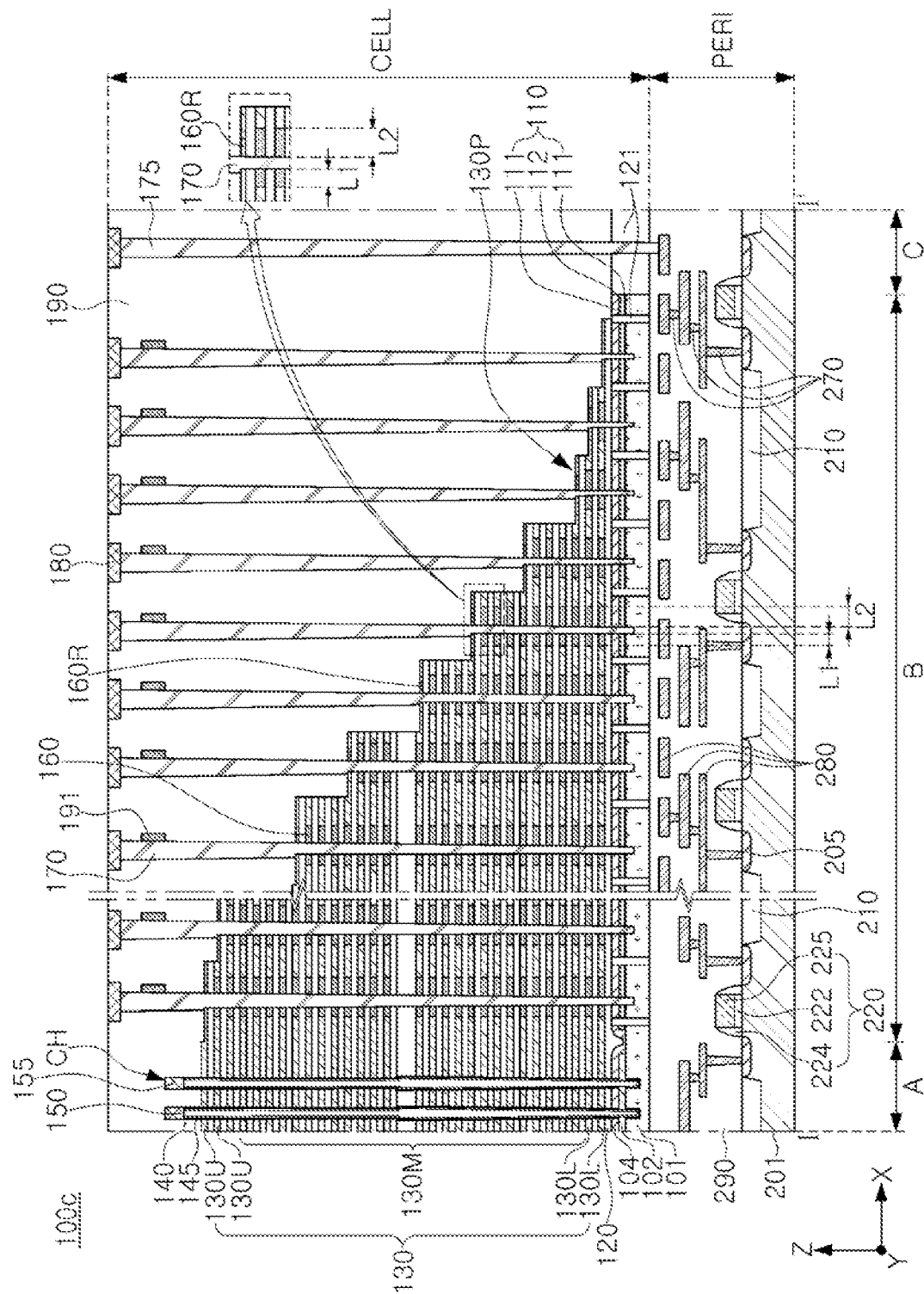
FIG. 5B is a cross-sectional view of a semiconductor device according to embodiments.

FIG. 5A is a partially enlarged view of a region 'D' of FIG. 2A, and FIG. 5B is a cross-sectional view of a semiconductor device according to embodiments.

Referring to FIG. 5A, according to embodiments, a contact plug 170 of a semiconductor device 100b includes a bent side surface portion CB on only a limited region along a circumference of a contact plug 170. Accordingly, a remaining region of a side surface of the contact plug 170 extends straight toward a second substrate 101, without any bumps, and limited region extends toward a second substrate 101, but with a bent portion. In this case, the contact plug 170 has an asymmetric shape with respect to a center thereof.

Referring to FIG. 5B, according to embodiments, a semiconductor device 100c further includes a pad insulating layer 160R that is in contact with at least one pad region 130P of the pads regions 130P of gate electrodes 130, and an upper insulating layer 191 disposed in cell insulating layers 190 on a side of and in contact with at least one contact plug 170 of the contact plugs 170.

According to embodiments, the semiconductor device 100c have a structure in which centers of the plug insulating layers 160 that are stacked in a Z direction and centers of the contact plug 170 do not match each other and are horizontally shifted in a plan view.

According to embodiments, a side surface of the pad insulating layer 160R is in contact with the pad region 130P and the contact plug 170. The pad insulating layer 160R, which is formed together with the plug insulating layers 160, is not removed when there is a large misalignment when forming a contact hole MCH for the contact plug 170, described below with reference to FIG. 12K. In an embodiment, the plug insulating layers 160 are also be asymmetrically disposed around the contact plug 170. As illustrated in the partially enlarged view of FIG. 5B, the plug insulating layers 160 have different horizontal lengths L1 and L2 on opposite sides adjacent to the contact plug 170 in a cross-section.

Similar to the pad insulating layer 160R, according to embodiments, an upper insulating layer 191 remains after a misalignment of the contact hole MCH. The upper insulating layer 191 is disposed between the contact plug 170 and the cell insulating layer 190, above the pad region 130P. The upper insulating layer 191 has a side surface in contact with at least one of the contact plugs 170. The upper insulating layer 191 is disposed above the pad insulating layer 160R. However, in other embodiments, the pad insulating layer 160R and the upper insulating layer 191 are not necessarily formed at the same time, and only one of the pad insulating layer 160R and the upper insulating layer 191 are provided.

As described above, according to embodiments, the structures of FIGS. 5A and 5B depend on the degree of alignment between a vertical extension portion 165 (see FIG. 12J) and the contact hole MCH when forming the contact hole MCH of the contact plug 170.

Figure 6:
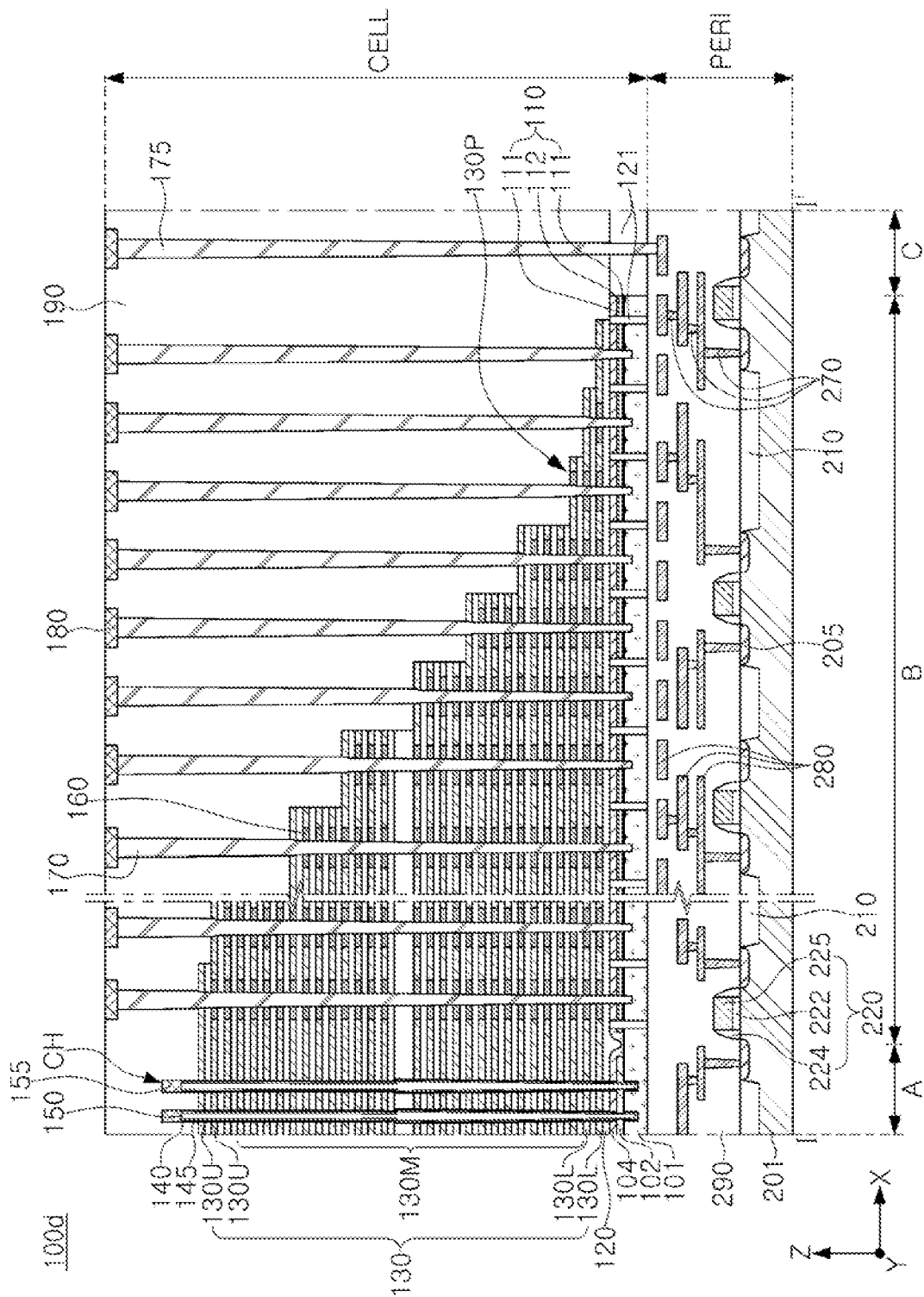
FIG. 6 is a schematic cross-sectional view of a semiconductor device according to embodiments.

FIG. 6 is a schematic cross-sectional view of a semiconductor device according to embodiments.

Referring to FIG. 6, according to embodiments, in a semiconductor device 100d, gate electrodes 130 do not decrease in thickness at end portions thereof and have a constant thickness in pad regions 130P, unlike those in the embodiments of FIGS. 2A to 3. However, the pad regions 130P and the other regions of the gate electrodes 130 have different physical properties. For example, the pad regions 130P may be subjected to a plasma doping (PLAD) treatment, or may be an ion-implanted region. Accordingly, the pad regions 130P may have a doped region that includes impurity elements, and may have physical properties, such as an etching rate, that differ from those of other regions.

Figure 7A:
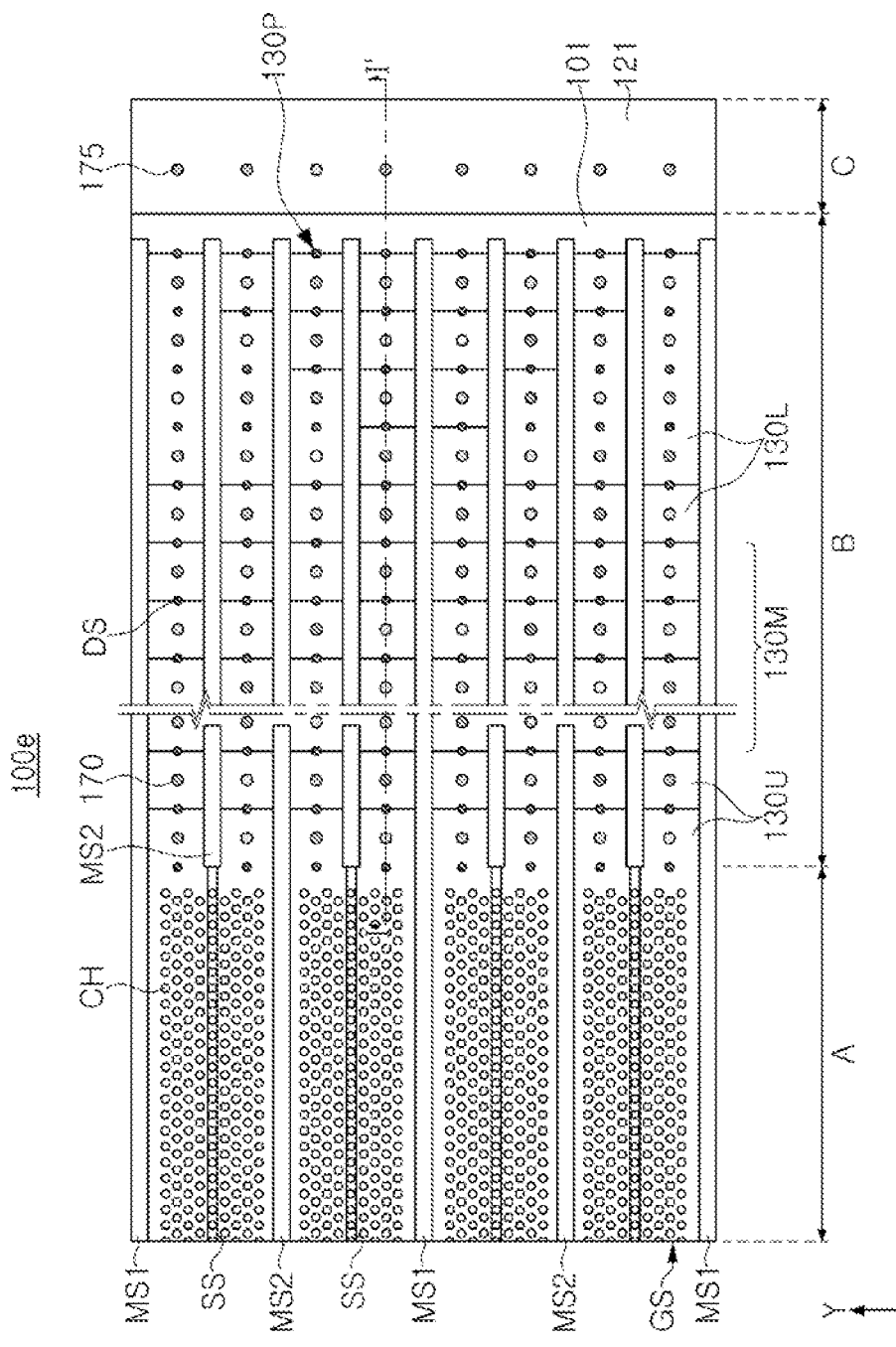
FIGS. 7A and 7B are a schematic plan view and a schematic cross-sectional view of a semiconductor device according to embodiments, respectively.
Figure 7B:
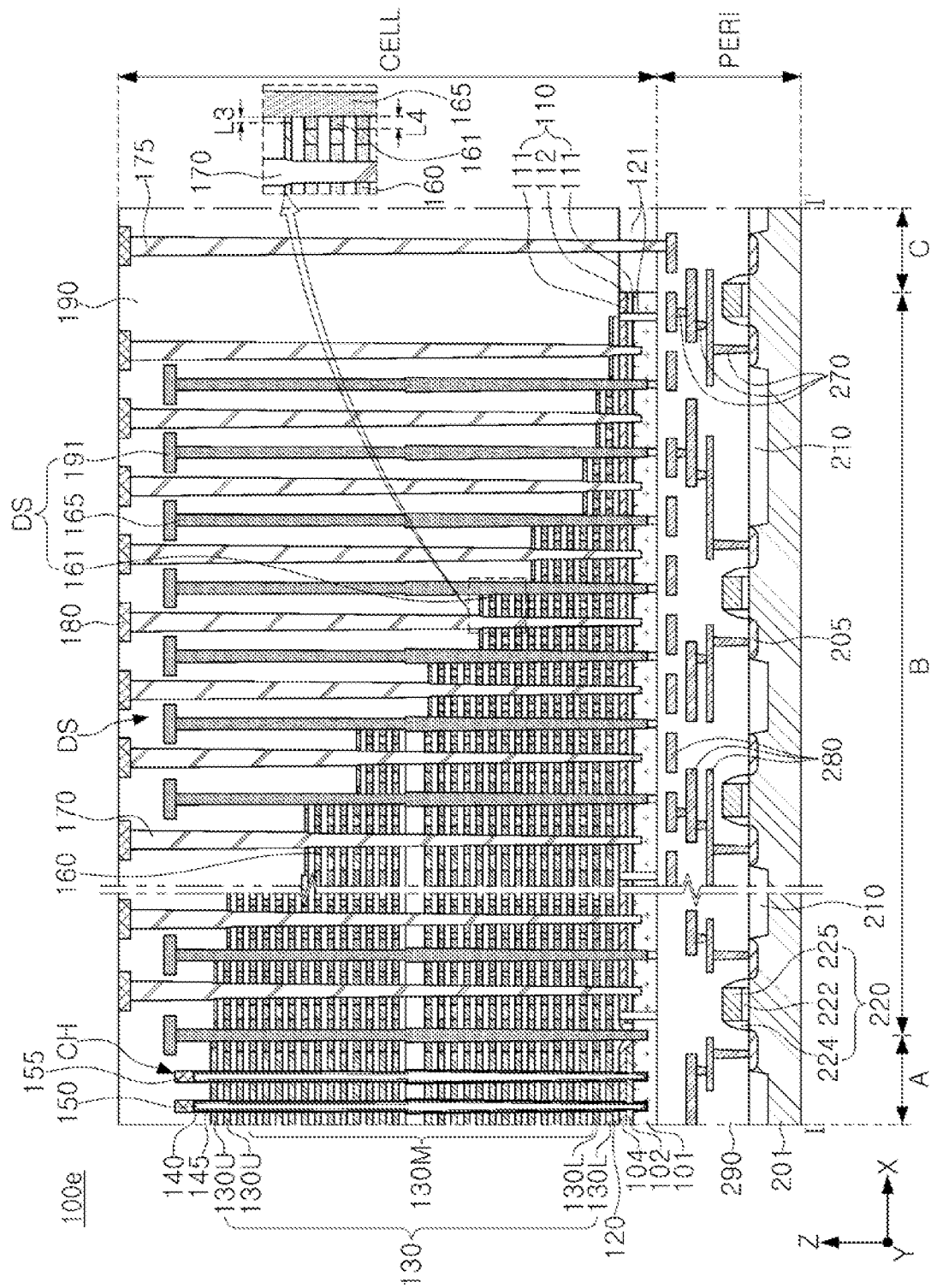

FIGS. 7A and 7B are a schematic plan view and a schematic cross-sectional view of a semiconductor device according to embodiments, respectively.

Referring to FIGS. 7A and 7B, according to embodiments, a semiconductor device 100e further include dummy pillar structures DS disposed between the contact plugs 170 in a second region B of a second substrate 101.

As illustrated in FIG. 7A, according to embodiments, the dummy pillar structures DS are disposed between contact plugs 170 that are adjacent in an X direction. However, the arrangement of the dummy pillar structures DS varies according to embodiments. For example, in some embodiments, the dummy pillar structures DS are disposed on four corners of each of the pad regions 130P and surround the contact plugs 170. In FIG. 7A, relative sizes of the dummy pillar structures DS and the contact plugs 170 varies according to embodiments.

As illustrated in FIG. 7B, according to embodiments, the dummy pillar structures DS penetrate through an end portion of the pad region 130P. Each of the dummy pillar structures DS includes an upper insulating layer 191 disposed at a top portion thereof, a vertical extension portion 165 that extends downward from the insulating layer 191 in a Z direction and has a 5, smaller width than the upper insulating layer 191, and horizontal extension portions 161 that extend from the vertical extension portion 165 parallel to the gate electrodes 130 such that a side surface of the horizontal extension portion 161 is in contact with the gate electrodes 130.

According to embodiments, similar to the channel structure CH, the vertical extension portion 165 have a stacked lower vertical extension portion and an upper vertical extension portion, and thus, have a bent portion. The horizontal extension portions 161 surround the vertical extension portion 165 and have a predetermined length between the gate electrodes 130 and the vertical extension portion 165. The horizontal extension portions 161 are parallel to the gate electrodes 130, and are alternately disposed with the interlayer insulating layers 120. An uppermost horizontal extension portion 161 is in contact with the pad region 130P. The dummy pillar structure DS is formed together with the vertical extension part 165, the plug insulating layers 160, and the upper insulating layer 191 during a manufacturing process to be described below with reference to FIG. 12I.

According to embodiments, as illustrated in the partially enlarged view of FIG. 7B, a length 13 from a side surface of the vertical extension portion 165 to an end of the uppermost extension portion 161 is less than a length L4 from a side surface of the vertical extension portion 165 to a corresponding end of the next lower horizontal extension portions 161, below the uppermost extension portion 161. This is because an uppermost sacrificial insulating layer 118 (see FIG. 12H) that was removed from a region in which the horizontal extension portion 161 is formed is less width due to a difference in thickness and/or physical properties of the pad region 130P. According to other embodiments, the plug insulating layer 160 and the horizontal extension portion 161 are in contact with each other between the contact structure 170 and the dummy pillar structure DS.

According to embodiments, the horizontal extension portion 161, the vertical extension portion 165, and the upper insulating layer 191 that constitute the dummy pillar structures DS are formed of an insulating material, such as the same material as that of the plug insulating layers 160.

Figure 8:
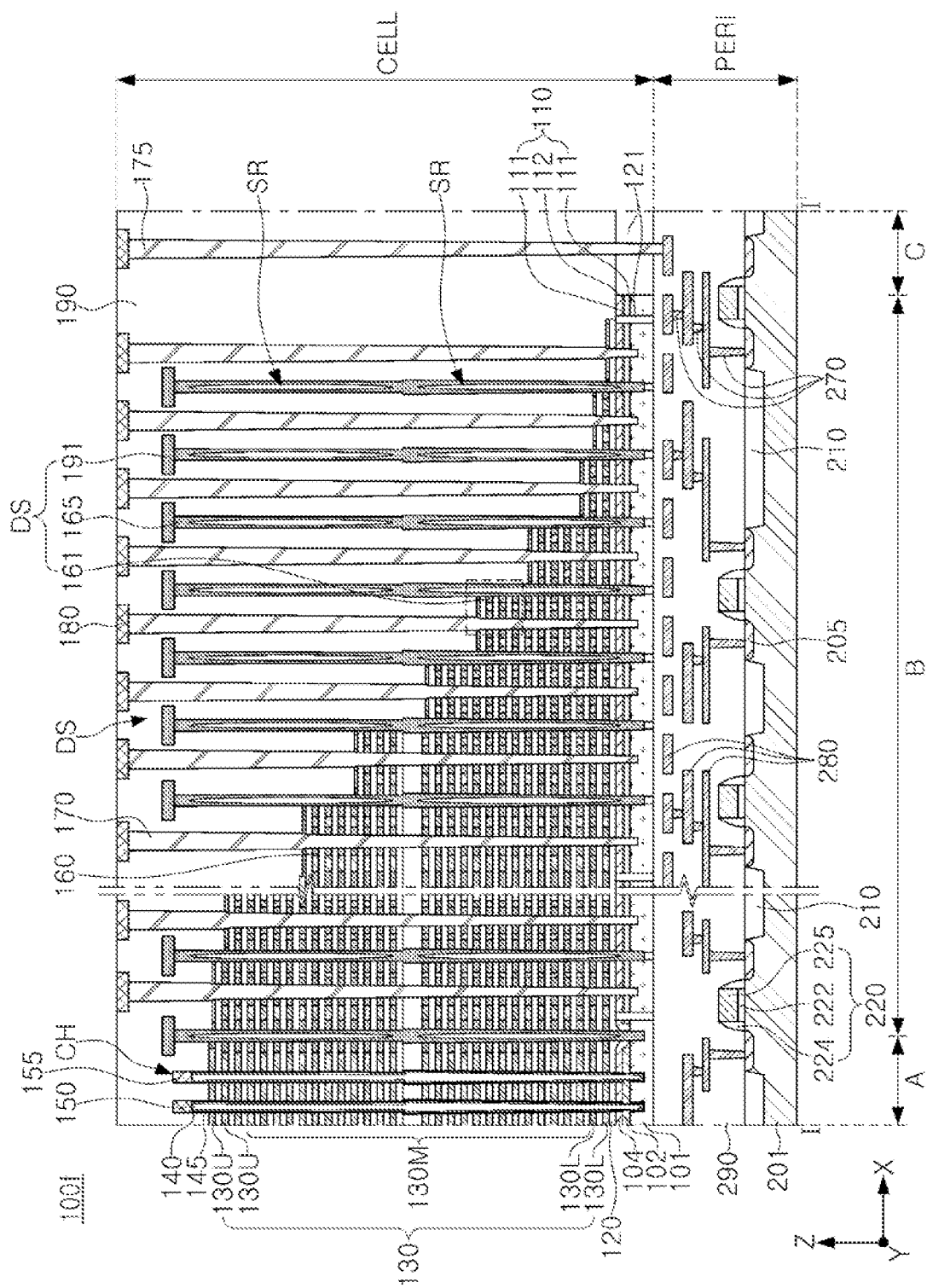
FIG. 8 is a schematic cross-sectional view of a semiconductor device according to embodiments.

FIG. 8 is a schematic cross-sectional view of a semiconductor device according to embodiments.

Referring to FIG. 8, according to embodiments, in a semiconductor device 100f, dummy pillar structures DS includes seam regions SR therein, unlike the embodiment of FIG. 7B. The seam regions SR include air. The seam regions SR are disposed in a lower vertical extension portion and an upper vertical extension portion of a vertical extension portion 165, respectively. A length and a shape of the seam regions SR varies according to embodiments.

Figure 9:
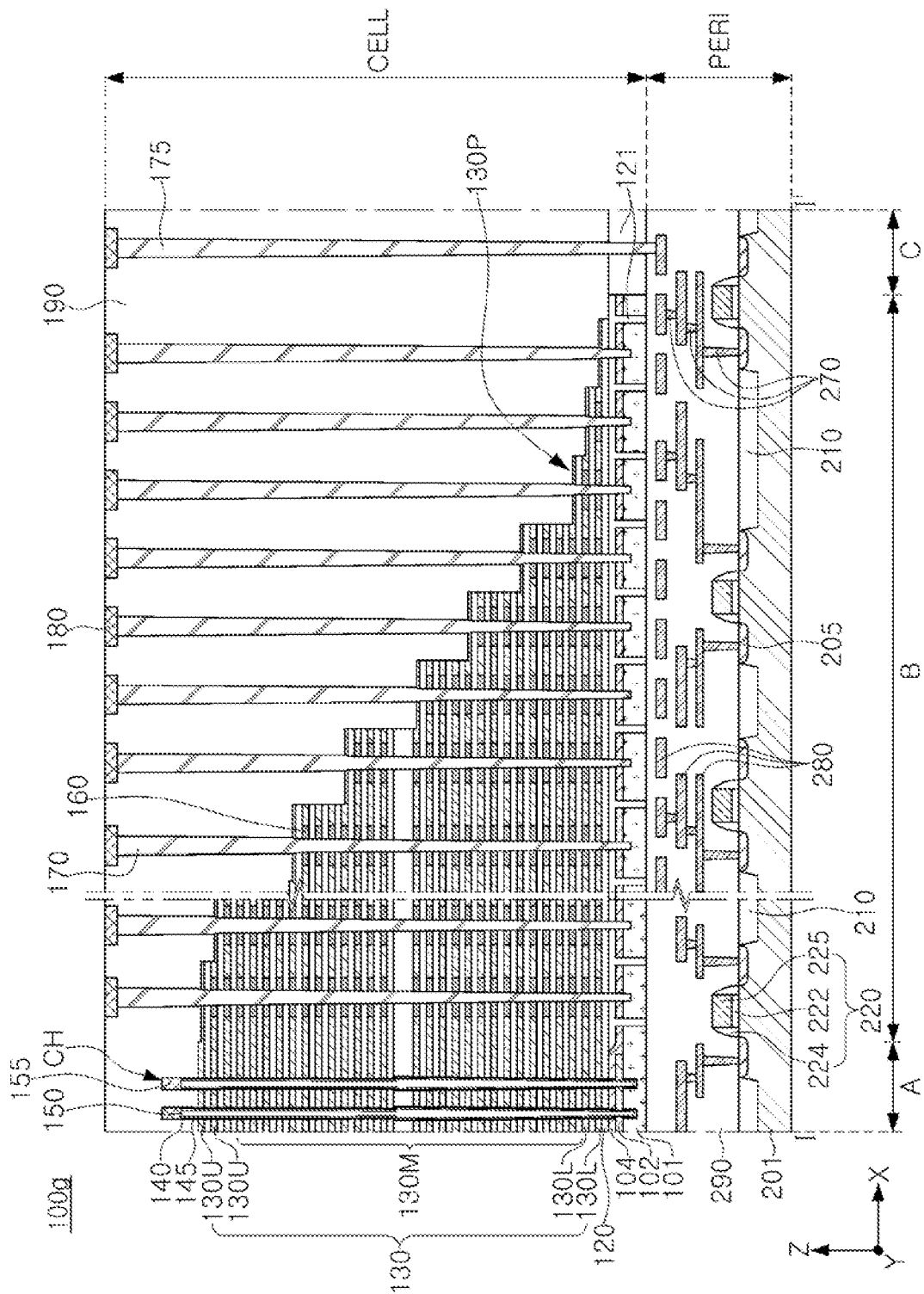
FIG. 9 is a schematic cross-sectional view of a semiconductor device according to embodiments.

FIG. 9 is a schematic cross-sectional view of a semiconductor device according to embodiments.

Referring to FIG. 9, according to embodiments, in a semiconductor device 100g, a second region B of a second substrate 101 is in contact with a second horizontal conductive layer 104. Unlike an embodiment of FIG. 2A, in the semiconductor device 100g, no horizontal insulating layer 110 is disposed in the second region B of the second substrate 101, and the second horizontal conductive layer 104 is bent from a first region A to extend onto the second substrate 101. Even in this case, the second horizontal conductive layer 104 and the second substrate 101 are separated by a substrate insulating layer 121. Thus, a process of forming the substrate insulating layer 121 is simpler than that in which the horizontal insulating layer 110 is disposed in a portion of the second region B. In an embodiment, the substrate insulating layer 121 has an upper surface coplanar with an upper surface of the second horizontal conductive layer 104, but embodiments are not limited thereto.

Figure 10A:
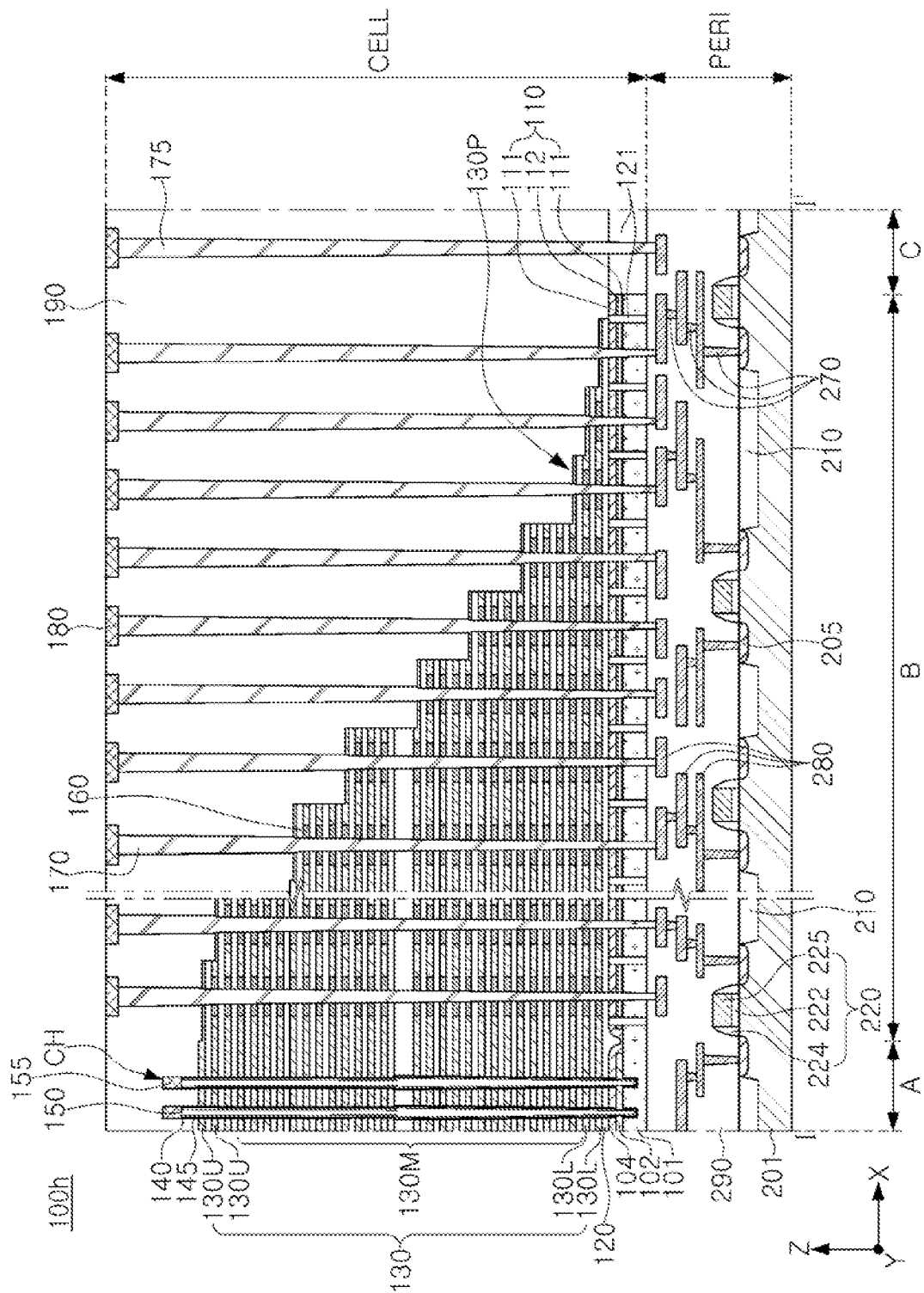
FIGS. 10A and 10B are schematic cross-sectional views of a semiconductor device according to embodiments.
Figure 10B:
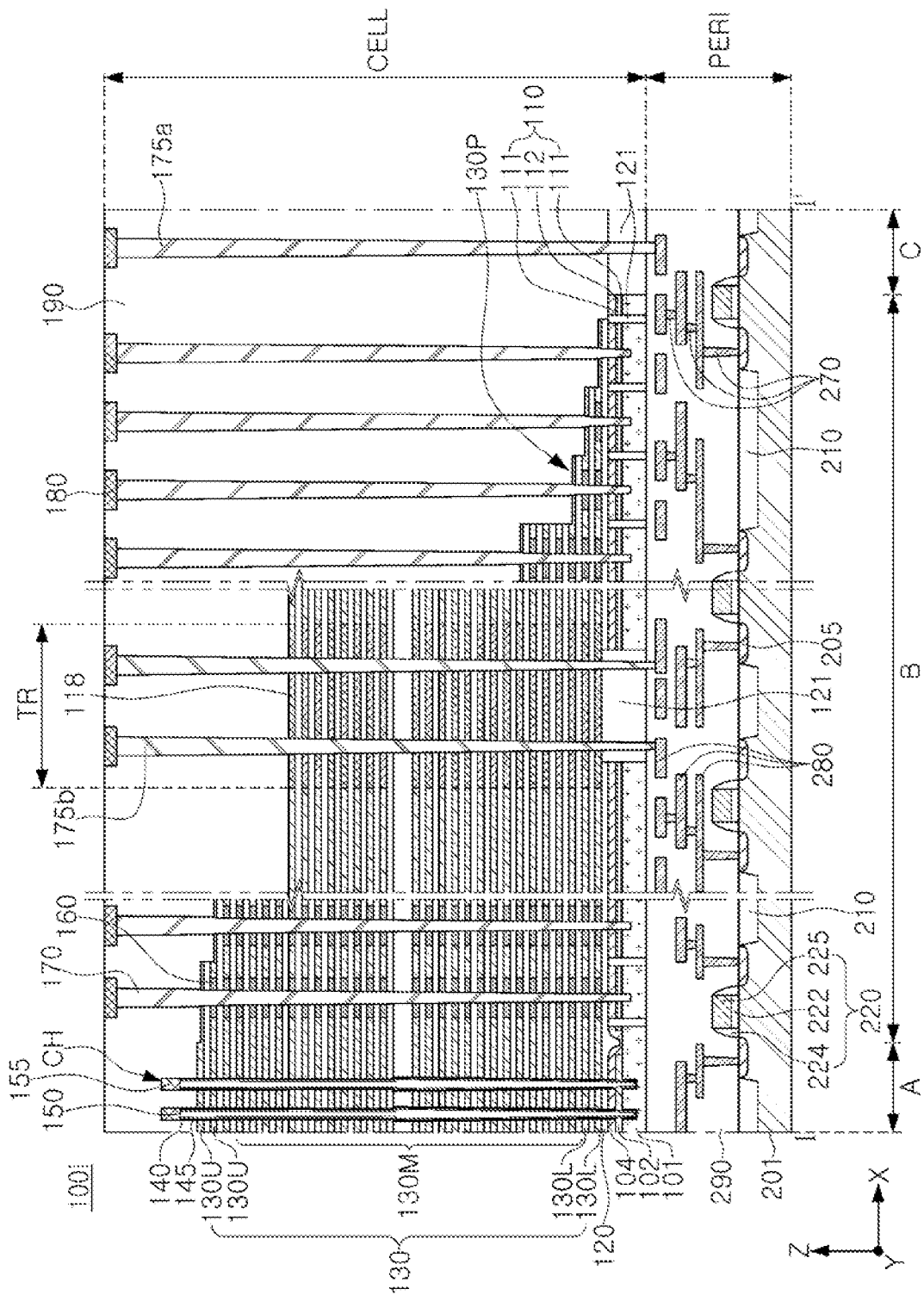

FIGS. 10A and 10B are schematic cross-sectional views of a semiconductor device according to embodiments.

Referring to FIG. 10A, according to embodiments, in a semiconductor device 100h, lower ends of contact plugs 170 are disposed in a peripheral circuit structure PERI. The contact plugs 170 penetrate through a second substrate 101, and penetrate into a portion of a lower peripheral insulating layer 290 and are connected to circuit interconnection lines 280. According to such a structure, the gate electrodes 130 are directly connected to the peripheral circuit structure PERI through the contact plugs 170.

Referring to FIG. 10B, according to embodiments, a semiconductor device 100i includes a memory cell structure CELL that further includes a through-interconnection region TR. The through-interconnection region TR includes a through-interconnection structure that electrically connects a memory cell region CELL and a peripheral circuit region PERI to each other. Unlike the first through-via 175a, the through-interconnection region TR is disposed in a second region B of a second substrate 101. According to other embodiments, the through-wring region TR is further disposed in a first region A.

According to embodiments, the through-interconnection region TR includes a second through-via 175b that extends from an upper portion of the memory cell region CELL in a Z direction through the second substrate 101, and a through-insulating region that surrounds the second through-via 175b. The through-insulating region TR includes sacrificial insulating layers 118, interlayer insulating layers 120 disposed alternately with the sacrificial insulating layers 118, and a substrate insulating layer 121 disposed in a lower portion of the through-insulating region. The through-interconnection region TR is disposed between a pair of adjacent first separation regions MS1 in a Y direction. According to such an arrangement, sacrificial insulating layers 118 remain in the through-interconnection region TR.

According to embodiments, the second through-via 175b penetrate through a cell insulating layer 190, the through-insulating region TR, and a portion of a peripheral insulating layer 290 from above, and extend in a direction that is perpendicular to an upper surface of the second substrate 101. An upper end of the second through-via 175b is connected to a cell interconnection line 180, and a lower end of the second through-via 175b is connected to a circuit interconnection line 280. The number, arrangement form, and shape of the second through-vias 175b in a single through-interconnection region TR varies in other embodiments. The second through-via 175b include the same conductive material as the first through-via 175a. Similar to the first through-via 175a, the second through-via 175b are formed in the same process as the contact plugs 170, and thus, include the same structure and the same material as the contact plugs 170.

According to embodiments, sacrificial insulating layers 118 are disposed at the same height and have the same thickness as the gate electrodes 130, and have side surfaces that are in contact with the gate electrodes 130 at a boundary of the through-interconnection region TR. The sacrificial insulating layers 118 are alternately stacked with the interlayer insulating layers 120 and form the through-insulating region IR. Each of the sacrificial insulating layers 118 may have the same width as the substrate insulating layer 121 disposed therebelow, or a width that differs from a width of the substrate insulting layer 121 disposed therebelow. The sacrificial insulating layers 118 are formed of an insulating material that differs from a material of the interlayer insulating layers 120, and includes, for example, a silicon oxide, a silicon nitride, or a silicon oxynitride.

Figure 11:
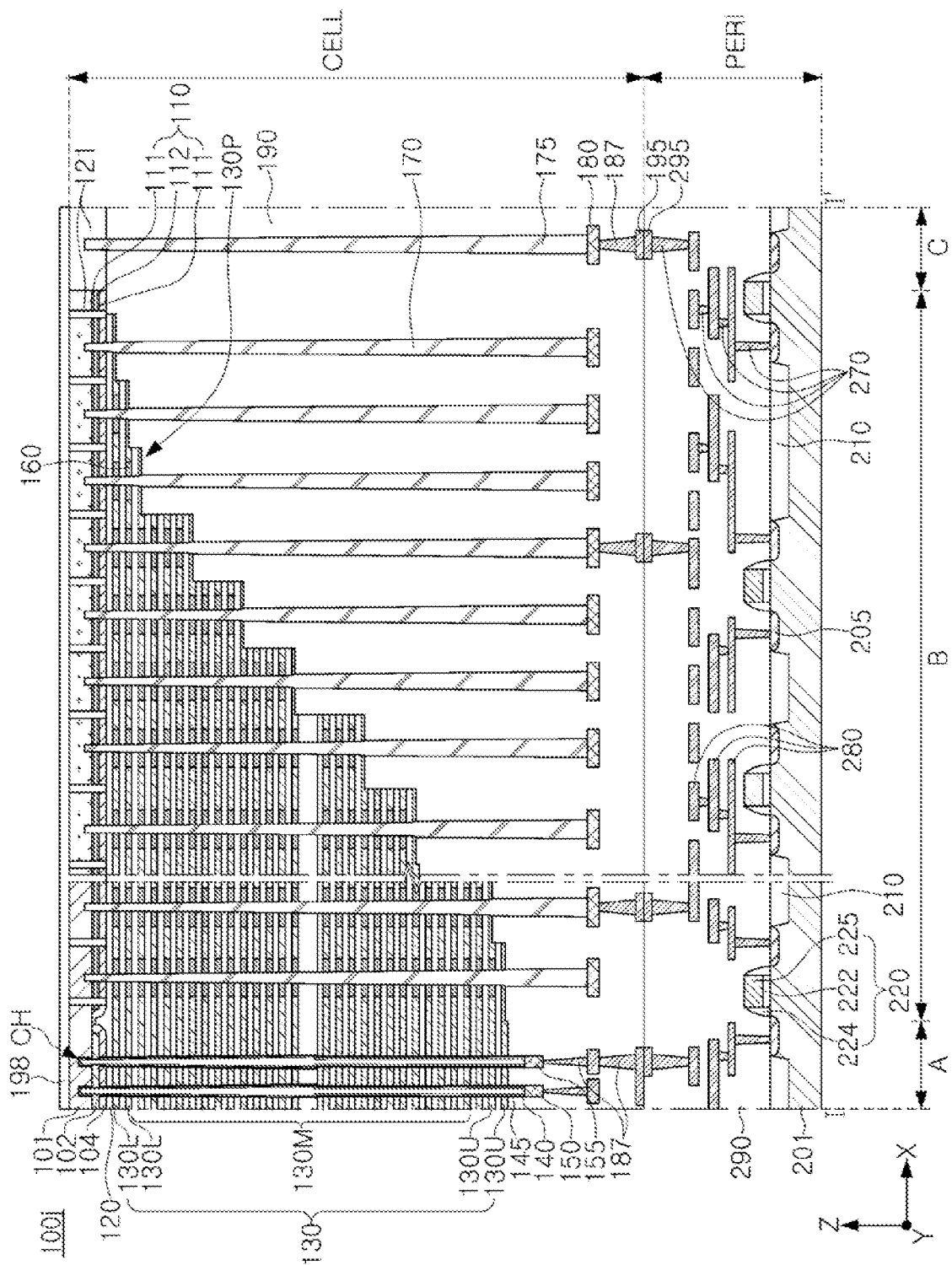
FIG. 11 is a schematic cross-sectional view of a semiconductor device according to embodiments.

FIG. 11 is a schematic cross-sectional view of a semiconductor device according to embodiments.

Referring to FIG. 11, according to embodiments, a semiconductor device 100j has a structure in which a peripheral circuit structure PERI and a memory cell structure CELL are vertically bonded to each other. To this end, the peripheral circuit structure PERI further includes first bonding metal layers 295, and the memory cell structure CELL further includes upper plugs 187, second bonding metal layers 195, and a passivation layer 198. The step structure of the gate electrodes 130 in FIG. 11 is inverted with respect to the gate electrode 130 step structure in FIGS. 2A, 5B, 6, 7B, 8-9, and 10A-B.

According to embodiments, the first bonding metal layers 295 is disposed above circuit contact plugs 270 and the circuit interconnection lines 280 such that upper surfaces of the first bonding metal layers 295 are exposed through a peripheral insulating layer 290 in the peripheral circuit structure PERI. The second bonding metal layers 195 are disposed below the upper plugs 187 such that lower surfaces of the second bonding metal layers 195 are exposed through the cell region insulating layer 190 in the memory cell structure CELL. The upper surfaces of the first bonding metal layers 295 are in contact with the lower surfaces of the second bonding metal layers 195 at an interface between the memory cell structure CELL and the peripheral circuit structure PERI. The first bonding metal layers 295 and the second bonding metal layers 195 each include a conductive material, for example, copper (Cu). In embodiments, each of the peripheral insulating layer 290 and the cell insulating layer 190 includes a bonding dielectric layer that surrounds the first bonding metal layers 295 and the second bonding metal layers 195 and has a predetermined depth from an upper or a lower surface thereof. The bonding dielectric layer includes, for example, at least one of SiO, SiN, SiCN, SiOC, SiON, or SiOCN. The passivation layer 198 is disposed on the second substrate 101 to protect the second substrate 101, and includes an insulating material.

According to embodiments, the peripheral circuit structure PERI and the memory cell structure CELL are bonded by the first bonding metal layers 295 and the second bonding metal layers 195 and the bonding dielectric layers. The bonding of the first bonding metal layers 295 and the second bonding metal layers 195 may be, for example, copper-to-copper (Cu—Cu) bonding, and the bonding of the bonding dielectric layers is a dielectric-to-dielectric bonding such as a SiCN—SiCN bonding. The peripheral circuit structure PERI and the memory cell structure CELL are bonded by a hybrid bonding that includes Cu-to-Cu bonding and dielectric-to-dielectric bonding.

FIGS. 12A to 12L are schematic cross-sectional views that illustrate a method of fabricating a semiconductor device according to embodiments.

Figure 12A:
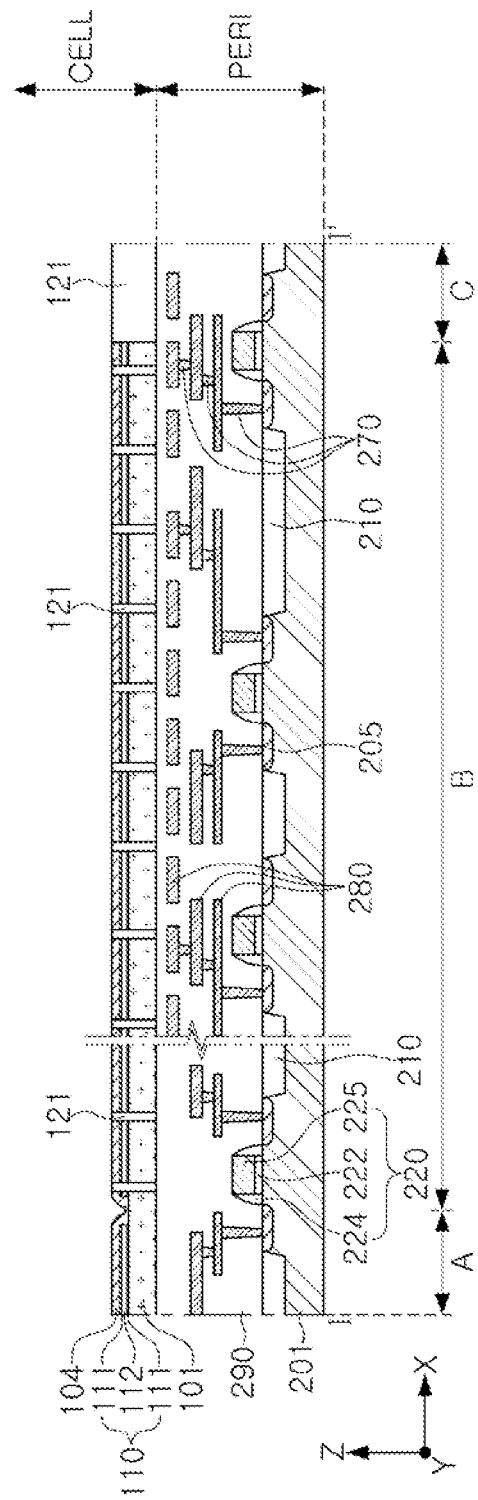
FIGS. 12A to 12L are schematic cross-sectional views that illustrate a method of fabricating a semiconductor device according to embodiments.

Referring to FIG. 12A, according to embodiments, a peripheral circuit structure PERI that includes circuit elements 220 and lower wiring structures is formed on a first substrate 201, and a second substrate 101 on which a memory cell structure CELL is provided, a horizontal insulating layer 110, a second horizontal conductive layer 104, and a substrate insulating layer 121 are formed on a peripheral circuit structure PERI.

According to embodiments, device isolation layers 210 are formed in the first substrate 201, and a circuit gate dielectric layer 222 and a circuit gate electrode 225 are sequentially formed on the first substrate 201. The device isolation layers 210 are formed by, for example, a shallow trench isolation (STI) process. The circuit gate dielectric layer 222 and the circuit gate electrode 225 are formed using atomic layer deposition (ALD) or chemical vapor deposition (CVD). The circuit gate dielectric layer 222 is formed of a silicon oxide, and the circuit gate electrode 225 is formed of at least one of polycrystalline silicon or a metal silicide, but embodiments are not limited thereto. Then, a spacer layer 224 and source/drain regions 205 are formed at opposite sidewalls of the circuit gate dielectric layer 222 and the circuit gate electrode 225. According to embodiments, the spacer layer 224 includes a plurality of layers. The source/drain regions 205 are formed by an ion implantation process.

According to embodiments, in the lower wiring structures, the circuit contact plugs 270 are formed by forming a portion of a peripheral insulating layer 290, etching the portion to be removed, and filling the removed portion with a conductive material. The circuit interconnection lines 280 are formed by, for example, depositing a conductive material and patterning the deposited conductive material.

According to embodiments, the peripheral region insulating layer 290 includes a plurality of insulating layers. A portion of the peripheral region insulating layer 290 is formed in each operation of forming the lower wiring structures, and another portion thereof is formed on an uppermost circuit interconnection line 280. Ultimately, the peripheral region insulating layer 290 covers the circuit elements 220 and the lower wiring structures.

Then, according to embodiments, the second substrate 101 is formed on the peripheral insulating layer 290. The second substrate 101 is formed of, for example, polycrystalline silicon, and is formed by a CVD process. The polycrystalline silicon that forms the second substrate 101 may include impurities.

According to embodiments, the first and second horizontal insulating layers 111 and 112 that constitute a horizontal insulating layer 110 are alternately stacked on the second substrate 101. The horizontal insulating layer 110 includes a portion to be replaced with the first horizontal conductive layer 102 of FIG. 2A through a subsequent process. The first horizontal insulating layers 111 include a different material from that of the second horizontal insulating layer 112. For example, the first horizontal insulating layers 111 are formed of the same material as interlayer insulating layers 120, and the second horizontal insulating layer 112 is formed of the same material as subsequent sacrificial insulating layers 118. A portion of the horizontal insulating layer 110 is removed from some regions by a patterning process, such as a second region B of the second substrate 101.

According to embodiments, the second horizontal conductive layer 104 is formed on the horizontal insulating layer 110, and is in contact with the second substrate 101 in a region in which the horizontal insulating layer 110 is removed. Accordingly, the second horizontal conductive layer 104 is bent along end portions of the horizontal insulating layer 110, and covers the end portions and extends onto the second substrate 101.

According to embodiments, in a third region C of the memory cell structure CELL and boundary regions of the first and second separation regions MS1 and MS2 of FIG. 1 and of gate electrodes 130 in a second region B, a substrate insulating layer 121 is formed that penetrates through the second substrate 101. The substrate insulating layer 121 is formed by removing portions of the second substrate 101, the horizontal insulating layer 110, and the second horizontal conductive layer 104 and filling the removed portions with an insulating material. After filling the insulating material, a planarization process is further performed using a chemical mechanical polishing (CMP) process. Accordingly, an upper surface of the substrate insulating layer 121 is substantially coplanar with an upper surface of the second horizontal conductive layer 104.

Figure 12B:
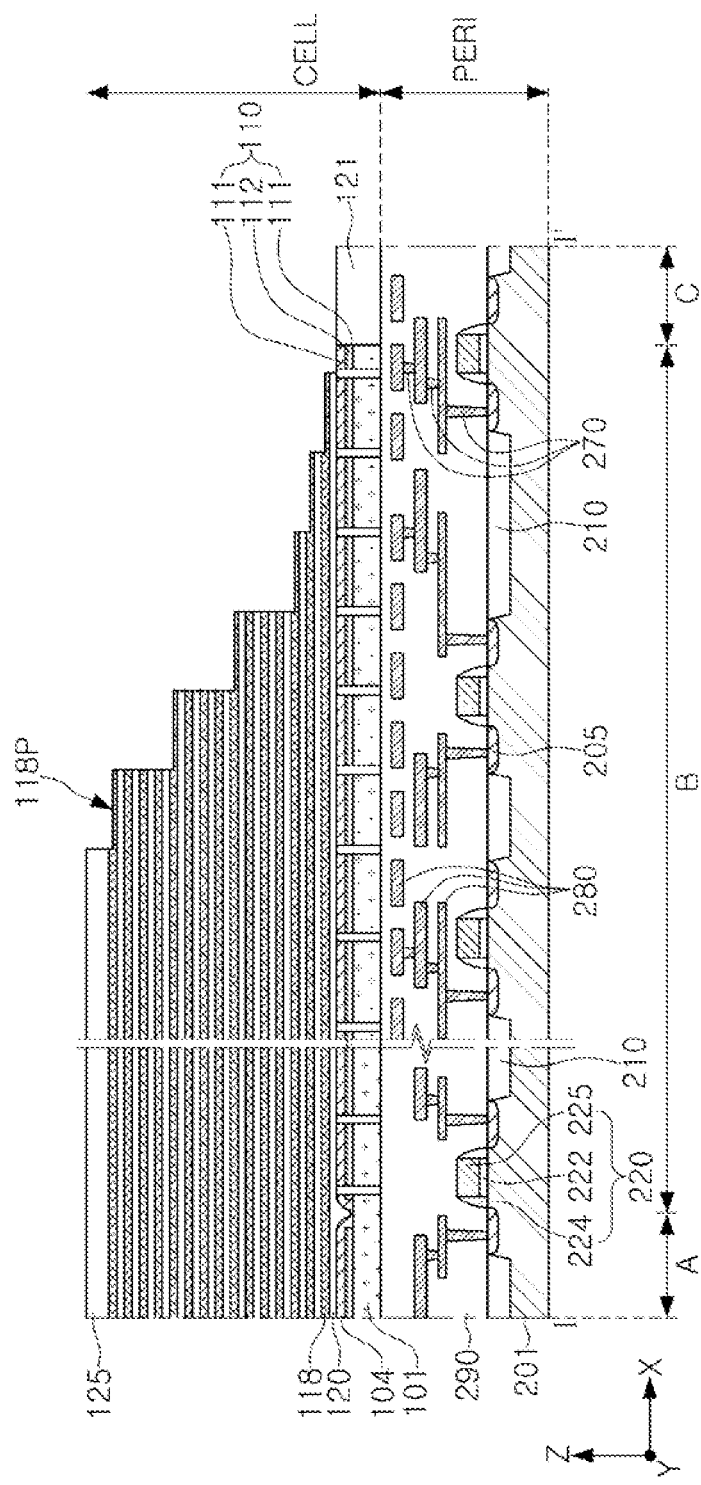

Referring to FIG. 12B, according to embodiments, sacrificial insulating layers 118 and interlayer insulating layers 120 that constitute a lower stack structure are alternately stacked on the second horizontal conductive layer 104, and a portion of the end portions of the sacrificial insulating layers 118 are removed.

In this operation, according to embodiments, the sacrificial insulating layers 118 and the interlayer insulating layers 120 are formed in a region in which the first channel structures CH1 (see FIG. 2B) are disposed. An upper interlayer insulating layer 125 that is relatively thick is formed in an uppermost portion. Portions of the sacrificial insulating layers 118 are replaced with gate electrodes 130 (see FIG. 2A) through a subsequent process. The sacrificial insulating layers 118 are formed of a different material from that of the interlayer insulating layers 120, and is formed of a material that has an etch selectivity with respect to the interlayer insulating layers 120 under certain etching conditions. For example, the interlayer insulating layer 120 and the upper interlayer insulating layer 125 include at least one of silicon, silicon oxide, silicon carbide, or silicon nitride, and the sacrificial insulating layers 118 include a material selected from silicon, silicon oxide, silicon carbide, or silicon nitride, that differs from the material of the interlayer insulating layer 120. In embodiments, the interlayer dielectric layers 120 do not have the same thickness. The thicknesses and the number of layers of the interlayer insulating layers 120 and the sacrificial insulating layers 118 can vary in other embodiments from that illustrated in the drawings.

Then, according to embodiments, a photolithography process and an etching process are repeatedly performed on the sacrificial insulating layers 118 using mask layers such that the sacrificial insulating layers 118 disposed above are shorter than the sacrificial insulating layers 118 disposed below in the second region B. Accordingly, the sacrificial insulating layers 118 form a step structure in predetermined units, and the sacrificial pad regions 118P disposed in uppermost portions of the sacrificial insulating layers 118 are upwardly exposed.

Then, according to embodiments, the sacrificial pad regions 118P are thinned by removing portions of the sacrificial pad regions 118P. The sacrificial pad regions 118P are formed to be relatively thin in the sacrificial insulating layers 118 by, for example, an etch-back process. Optionally, in other embodiments, a composition and/or physical properties of the sacrificial pad regions 118P can be changed by further performing a plasma treatment process such as the above-mentioned PLAD process, the above-mentioned ion implantation process, etc.

Figure 12C:
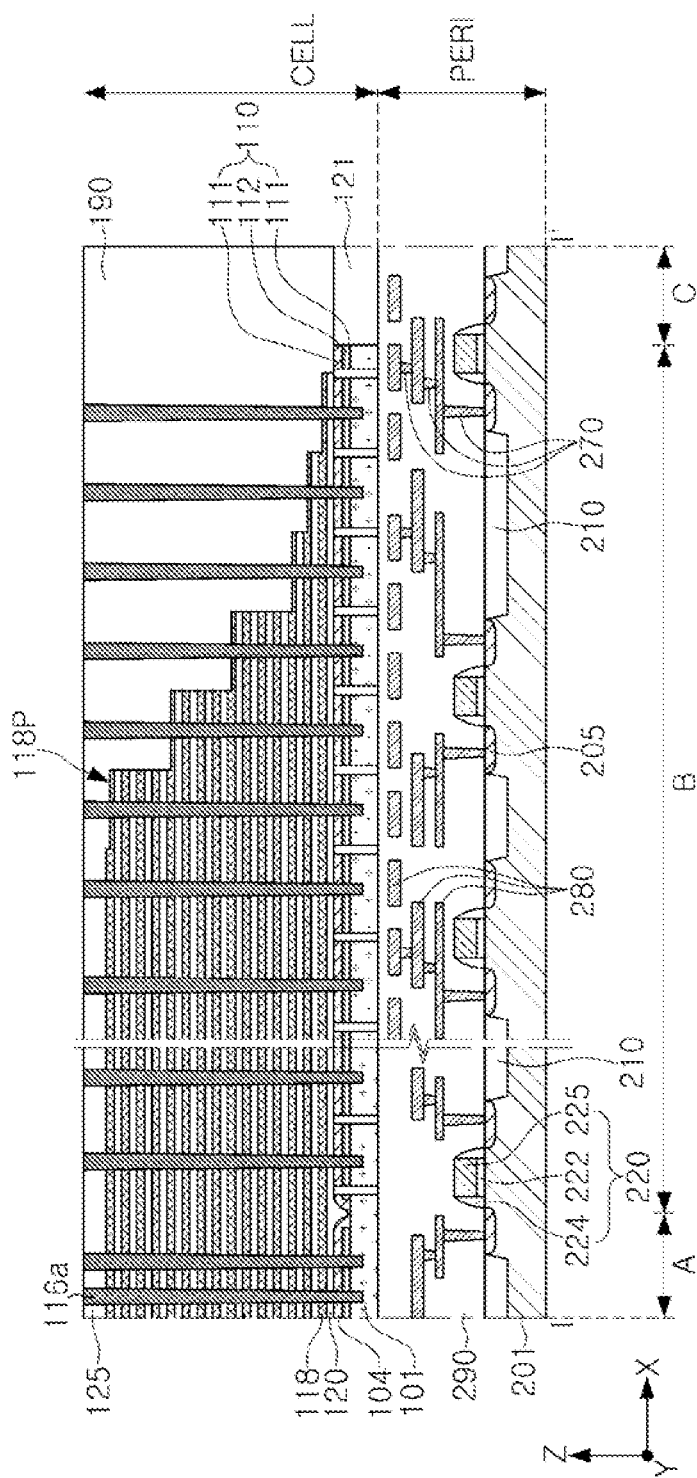

Referring to FIG. 12C, according to embodiments, first channel sacrificial layers 116a are formed that penetrate through the lower stack structure.

According to embodiments, a portion of a cell region insulating layer 190 is formed that covers the lower stack structure of the sacrificial insulating layers 118 and the interlayer insulating layers 120.

Then, according to embodiments, the first channel sacrificial layers 116a are formed in a region in the first region A that corresponds to the first channel structures CH1 (see FIG. 2B) and are formed in a region in the second region B in which the contact plugs 170 are disposed. In embodiments of FIGS. 7A to 8, the first channel sacrificial layers 116a are also formed in a region in the second region B in which dummy pillar structures DS are formed.

According to embodiments, the first channel sacrificial layers 116a are formed by forming lower holes that penetrate through the lower stack structure and then depositing a material in the lower holes that forms the first channel sacrificial layers 116a. The first channel sacrificial layers 116a include, for example, polycrystalline silicon.

Figure 12D:
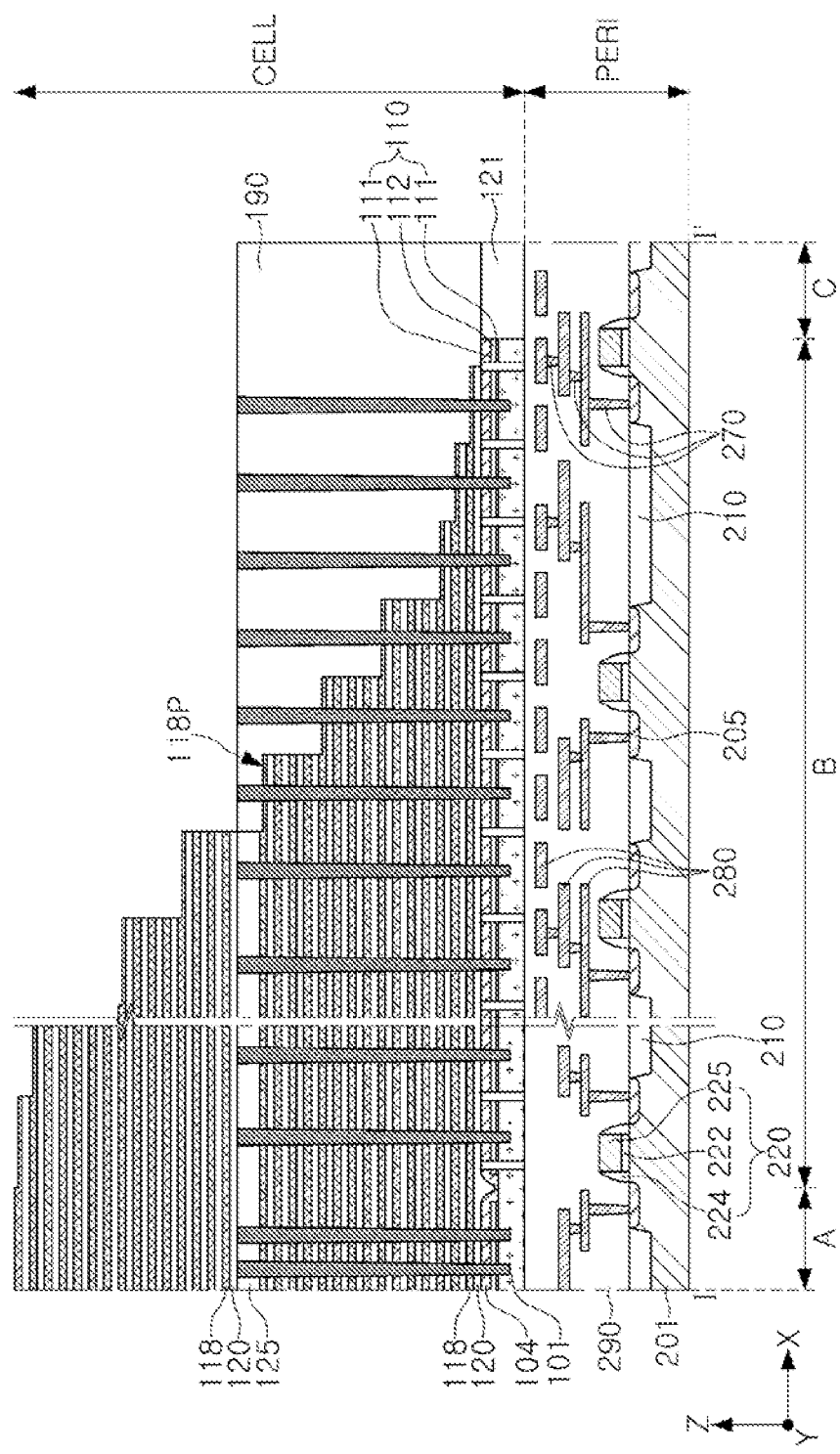

Referring to FIG. 12D, according to embodiments, sacrificial insulating layers 118 and interlayer insulating layers 120 that constitute an upper stack structure are alternately stacked on the lower stack structure, and then a step structure is formed and a portion of the end portions of the sacrificial insulating layers 118 is removed.

In this operation, according to embodiments, in an upper region in which the second channel structures CH2 (see FIG. 2B) are disposed, the same process as that described with reference to FIG. 12B is performed on the upper stack structure.

Figure 12E:
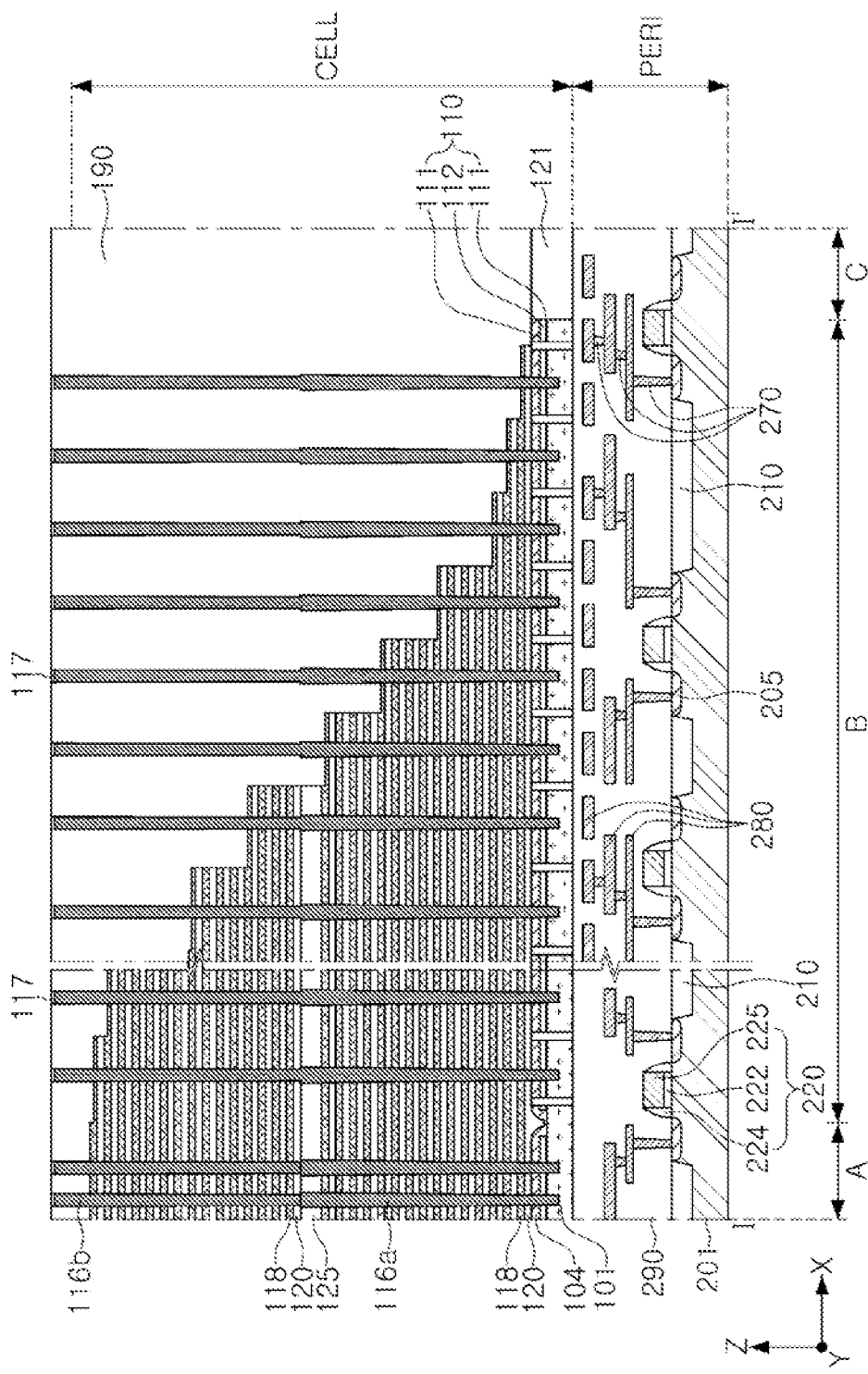

Referring to FIG. 12E, according to embodiments, the second channel sacrificial layers 116b are formed that penetrate through the upper stack structure, and upper ends of second channel sacrificial layers 116b are oxidized to form sacrificial oxide layers 117.

According to embodiments, a portion of the cell region insulating layer 190 is formed that covers the upper stack structure.

Then, according to embodiments, the second channel sacrificial layers 116b are formed by forming upper holes that expose upper ends of the first channel sacrificial layers 116a through the upper stack structure, and then depositing a material in the upper holes that forms the second channel sacrificial layers 116b. The second channel sacrificial layers 116b include, for example, polycrystalline silicon.

Then, according to embodiments, an oxidation process is performed such that the upper ends of the second channel sacrificial layers 116b are oxidized to form the sacrificial oxide layers 117. The sacrificial oxide layers 117 are provided so that the first and second sacrificial channel layers 116a and 116b can be easily removed only from the first region A in a subsequent process. However, a process of forming the sacrificial oxide layers 117 is omitted according to other embodiments.

Figure 12F:
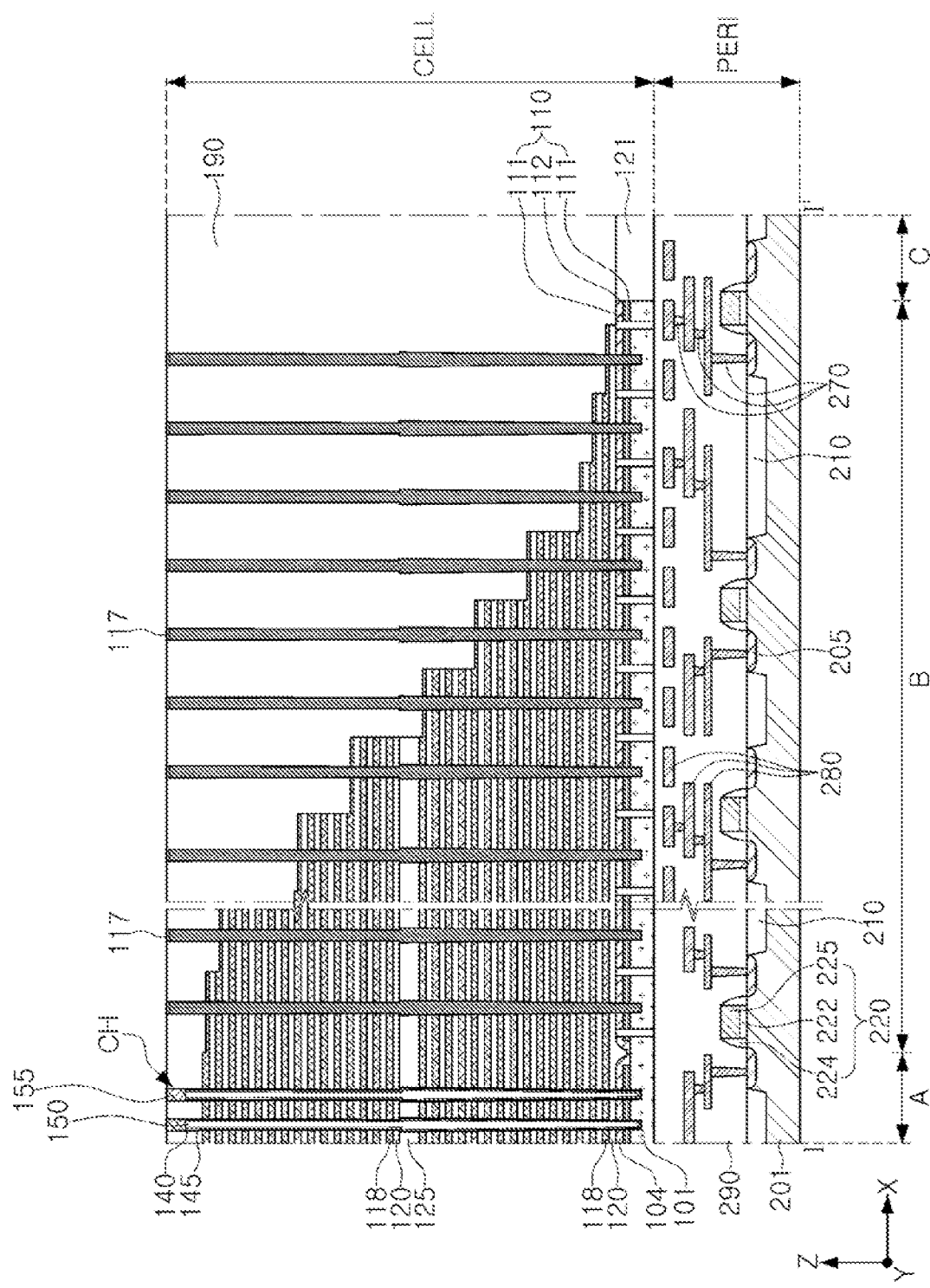

Referring to FIG. 12F, according to embodiments, in the first region A, the first and second sacrificial channel layers 116a and 116b are removed and channel structures CH are formed.

According to embodiments, in the upper stack structure, portions of the sacrificial insulating layers 118 and the interlayer insulating layers 120 are removed to form an upper separation region SS (see FIG. 1). To form the upper separation region SS, a region in which the upper separation region SS is to be formed is exposed using an additional mask layer, a predetermined number of sacrificial insulating layers 118 and interlayer insulating layers are removed from an uppermost portion, and then an insulating material is deposited to form an upper insulating layer 103 (see FIG. 2B).

According to embodiments, the channel structures CH are formed by removing the first and second sacrificial channel layers 116a and 116b to form channel holes and then filling the channel holes. Specifically, the channel structures CH are formed by sequentially forming a gate dielectric layer 145, a channel layer 140, a channel buried insulating layer 150, and channel pads 155 in the channel holes. In this operation, at least a portion of the gate dielectric layer 145 that extends vertically along the channel layer 140 is formed. The channel layer 140 is formed in the channel structures CH on the gate dielectric layer 145. The channel filling insulating layer 150 fills the channel structures CH, and is an insulating material. However, according to other embodiments, a space between the channel layers 140 is filled with a conductive material, rather than the channel filling insulating layer 150. The channel pads 155 are formed of a conductive material, such as polycrystalline silicon.

Figure 12G:
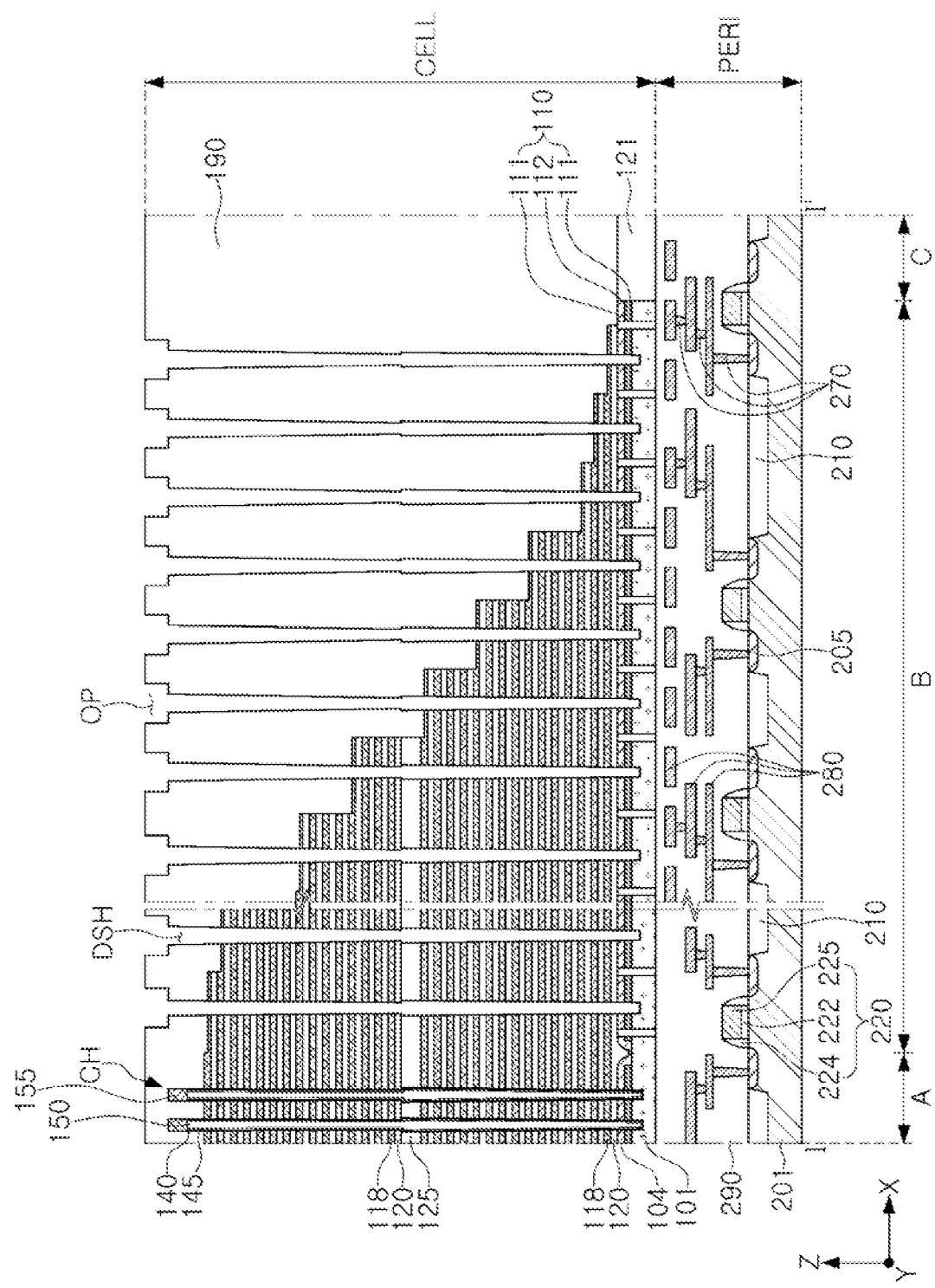

Referring to FIG. 12G, according to embodiments, in the second region B, dummy openings OP are formed and the first and second sacrificial channel layers 116a and 116b are removed to form dummy holes DSH.

According to embodiments, a portion of the cell region insulating layer 190 is further formed. In the second region B, the dummy openings OP are formed such that a cell insulating layer 190 on the second sacrificial channel layers 116b is removed to expose second sacrificial channel layers 116b. Therefore, according to embodiments, when no cell insulating layer 190 is additionally formed on the second sacrificial channel layers 116b, a process of forming the dummy openings OP can be omitted. The dummy openings OP have a relatively large width, as compared with the dummy holes DSH.

According to embodiments, the dummy holes DSH are formed by removing the first and second sacrificial channel layers 116a and 116b.

Figure 12H:
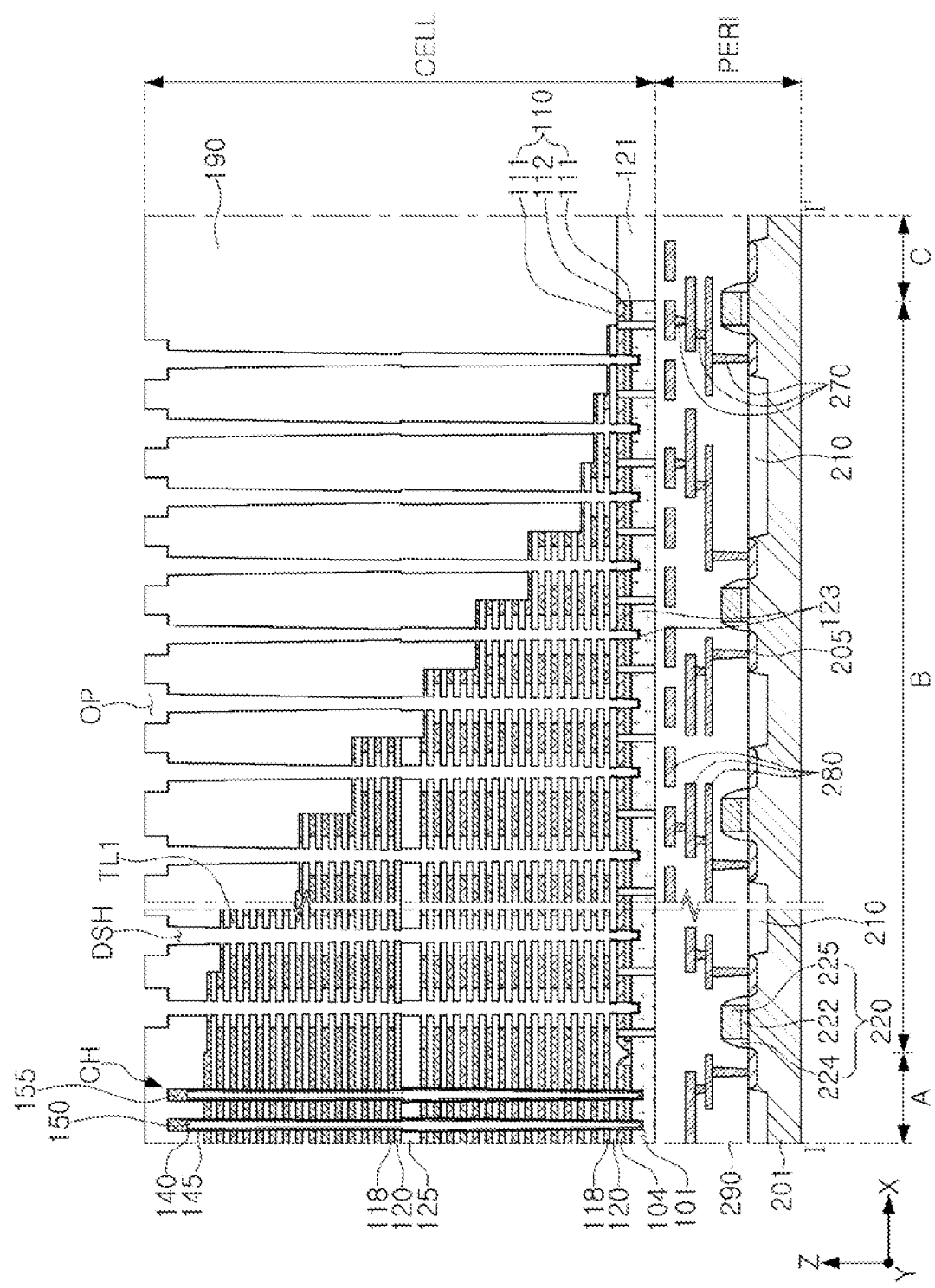

Referring to FIG. 12H, according to embodiments, a portion of the sacrificial insulating layers 118 that is exposed through the dummy holes DSH is removed.

According to embodiments, the second horizontal conductive layer 104 and a region of the second substrate 101 that is exposed through the dummy holes DSH are oxidized to form an oxide layer 123. The oxide layer 123 protects the second horizontal conductive layer 104 and the exposed region of the second substrate 101.

According to embodiments, by introducing an etchant through the dummy holes DSH, a predetermined length of the sacrificial insulating layers 118 is removed around the circumferences of the dummy holes DSH. Thus, first tunnel portions TL1 are formed. Each of the tunnel portions TL1 is relatively short in the sacrificial pad regions 118P and is relatively long on the sacrificial insulating layers 118 below the sacrificial pad regions 118P. This is because the sacrificial pad regions 118P have a decreased thickness as compared with the other regions, so that the amount of the introduced etchant is relatively small. Alternatively, according to other embodiments, a difference in physical properties of the sacrificial pad regions 118P results in a low etching rate, so that the sacrificial pad regions 118P may be etched to different lengths.

Figure 12I:
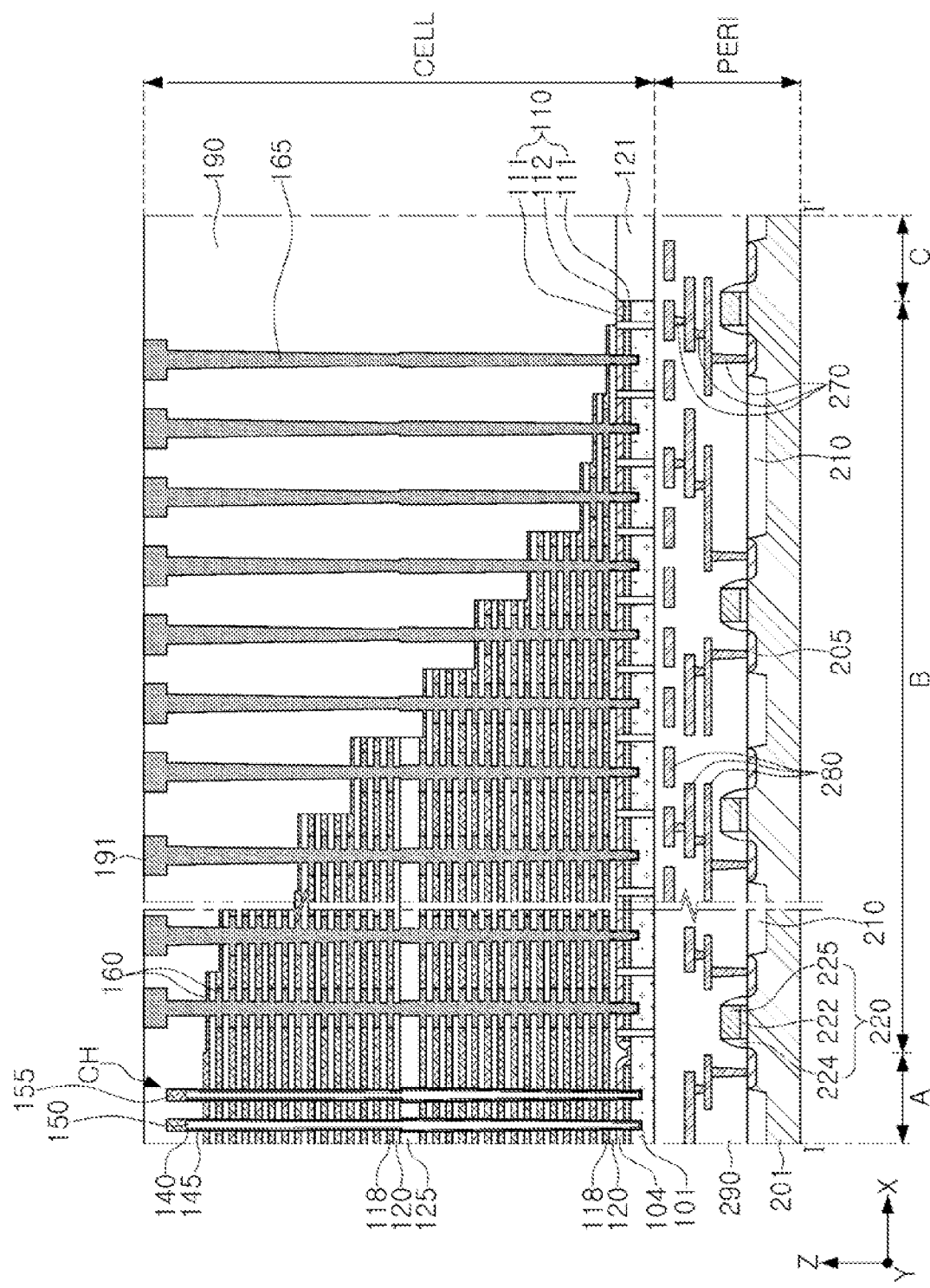

Referring to FIG. 12I, according to embodiments, the first tunnel portions TL1, the dummy holes DSH, and the dummy openings OP are filled with an insulating material to form plug insulating layers 160, a vertical extension portion 165, and an upper insulating layer 191.

According to embodiments, the insulating material is deposited by, for example, an atomic layer deposition (ALD) process to form the plug insulating layers 160 that fill the first tunnel portions TL1, the vertical extension portion 165 that fill the dummy holes DSH, and the upper insulating layer 191 that fill the dummy openings OP.

Figure 12J:
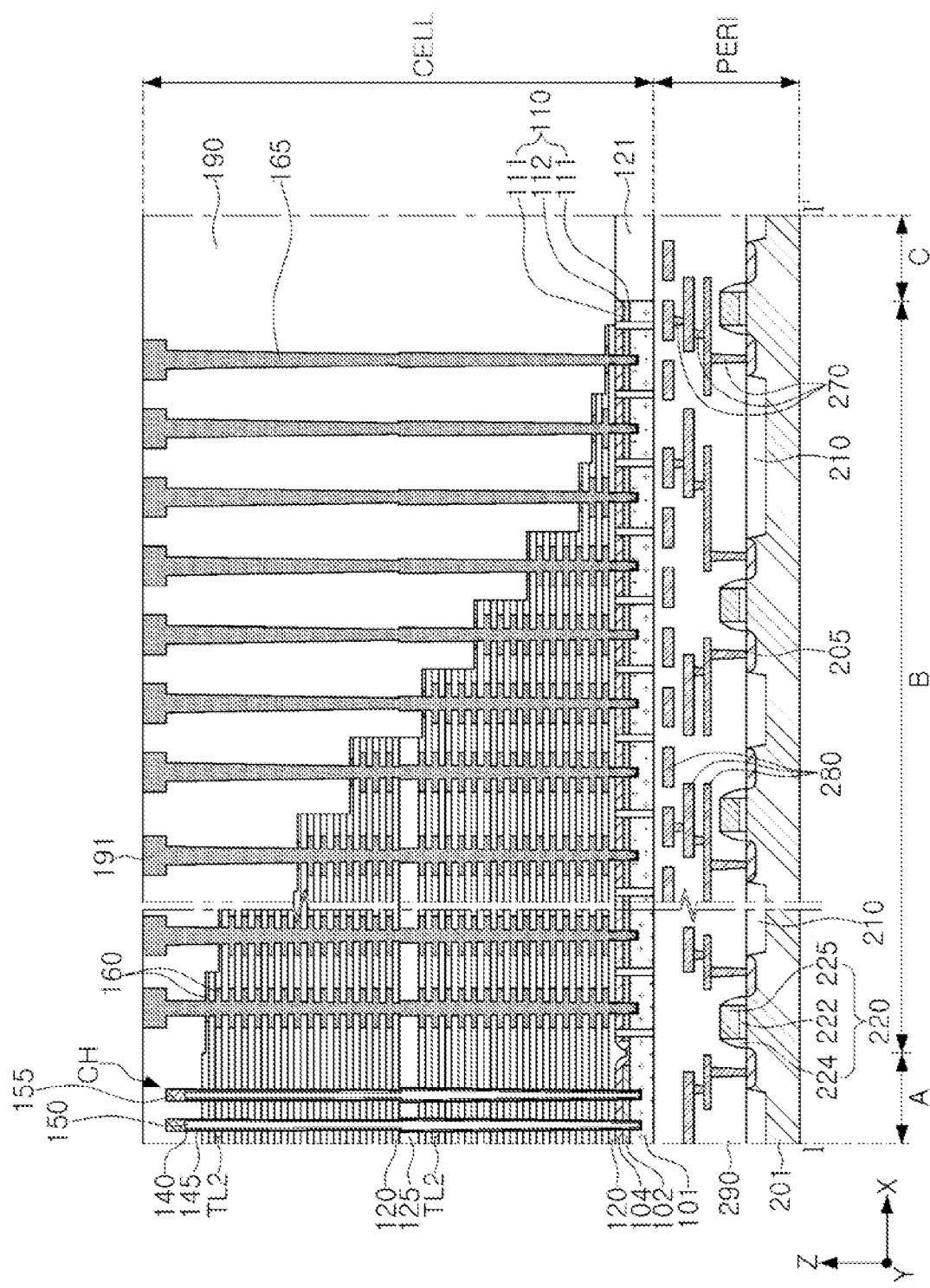

Referring to FIG. 12J, according to embodiments, the sacrificial insulating layers 118 are removed to form the second tunnel portions TL2.

According to embodiments, in regions of the first and second separation regions MS1 and MS1 (see FIG. 1), openings are formed that extend to the second substrate 101 through the sacrificial insulating layers 118 and the interlayer insulating layers 120.

Then, according to embodiments, an etch-back process is performed that exposes the second horizontal insulating layers 112 in the first region A while forming additional sacrificial spacer layers in the openings. The second horizontal insulating layer 112 is selectively removed from the exposed region, and then the first horizontal insulating layers 111 disposed thereabove and therebelow are removed. The first and second horizontal insulating layers 111 and 112 are removed by, for example, a wet etching process. During the process of removing the first and second horizontal insulating layers 111 and 112, a portion of the exposed gate dielectric layer 145 is also removed in a region in which the second horizontal insulating layer 112 is removed. The first horizontal conductive layer 102 is formed by depositing a conductive material in the region in which the first and second horizontal insulating layers 111 and 112 are removed, and then the sacrificial spacer layers are removed from the openings. Due to this process, the first horizontal conductive layer 102 is formed in the first region A.

Then, according to embodiments, the sacrificial insulating layers 118 is selectively removed using, for example, wet etching with respect to the interlayer insulating layers 120, the second horizontal conductive layer 104, and the substrate insulating layer 121. Accordingly, second tunnel portions TL2 are formed between the interlayer insulating layers 120.

Figure 12K:
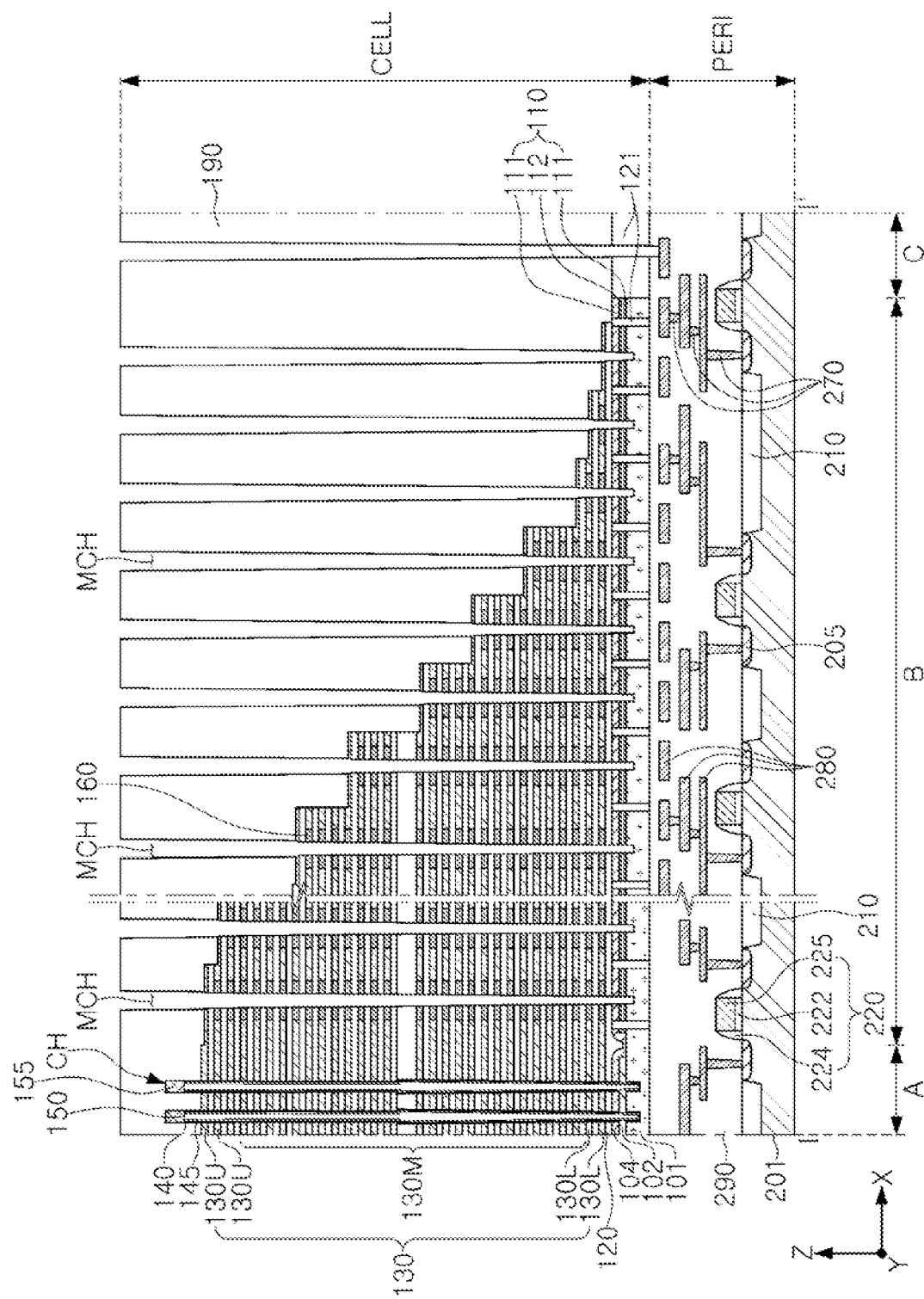

Referring to FIG. 12K, according to embodiments, the second tunnel portion TL2 is filled with a conductive material to form gate electrodes 130, and contact holes MCH that form contact plugs 170 and a through-via 175 are formed.

According to embodiments, the conductive material that forms the gate electrodes 130 fills the second tunnel portions TL2. The conductive material may include a metal, polycrystalline silicon, or a metal silicide material. After forming the gate electrodes 130, a separation insulating layer 105 (see FIG. 2B) is formed in the openings in the first and second separation regions MS1 and MS2. Another portion of the cell region insulating layer 190 is further formed.

Then, according to embodiments, in the second region B, contact holes MCH are formed that extend from above into the second substrate 101 through the upper insulating layers 191 and the vertical extension portions 165. The contact holes MCH may form a recess in a portion of the second substrate 101, or may extend to an upper surface of the second substrate 101 according to embodiments. When the contact holes MCH are formed, a portion of the plug insulating layers 160 are penetrated and removed, but embodiments are not limited thereto. In addition, according to embodiments, a portion of the upper insulating layers 191 remains around the contact holes MCH.

According to embodiments, the contact holes MCH are self-aligned due to differences in etch selectivity between the pad regions 130P of the gate electrodes 130 and the plug insulating layers 160. Accordingly, the contact holes MCH are bent along an upper surface of the pad regions 130P or within the pad regions 130P, and mainly extend along the vertical extension portions 165 and the plug insulating layers 160. In this operation, in the third region C, the contact holes MCH are formed together with the through-via 175. As described above, the contact holes MCH that form the contact plugs 170 and the contact holes MCH that form the through-via 175 can be simultaneously formed to simplify a process and to reduce costs.

Figure 12L:
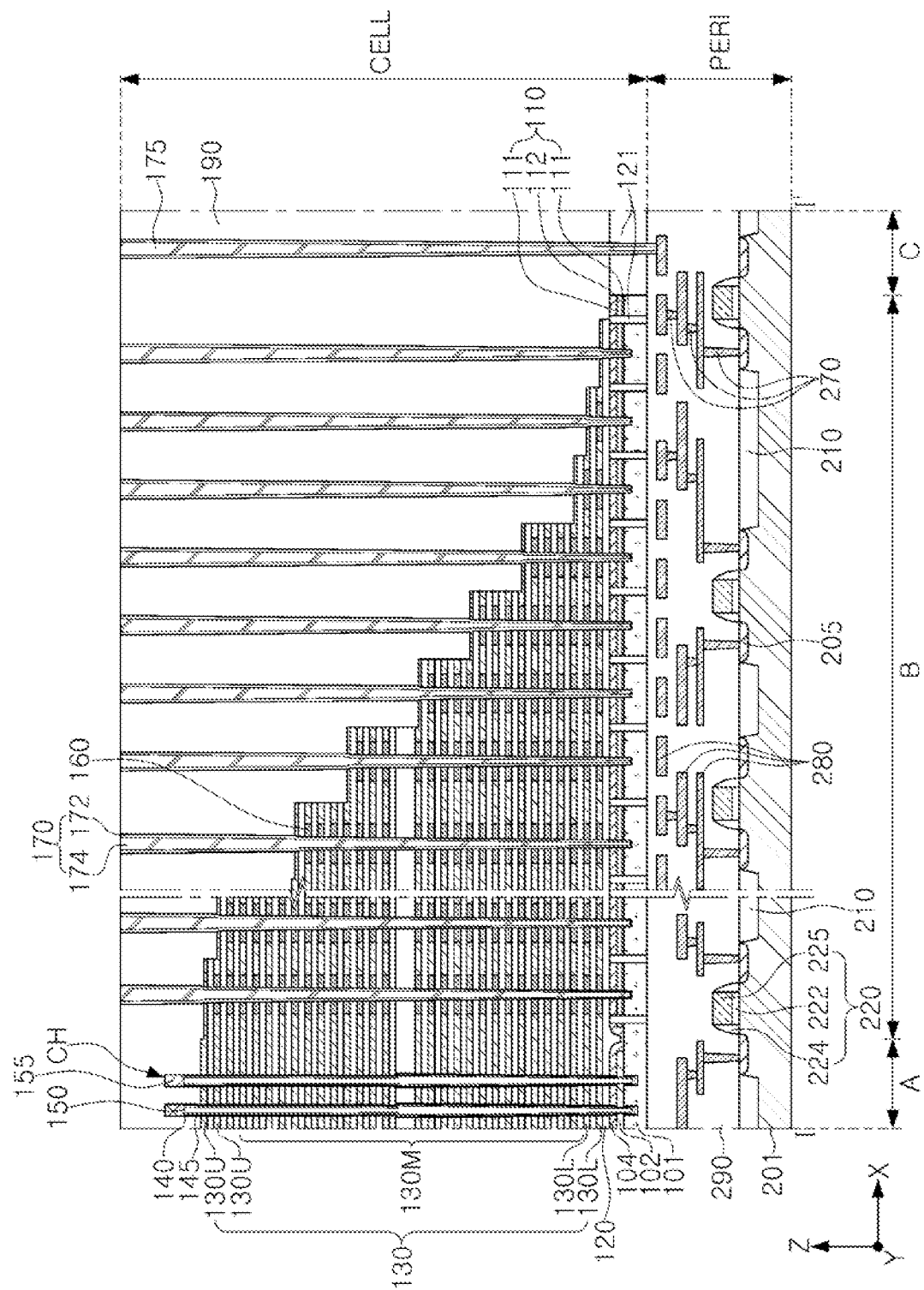

Referring to FIG. 12L, according to embodiments, a conductive material is deposited in the contact holes MCH to form contact plugs 170 and through-vias 175.

According to embodiments, the contact plugs 170 include a barrier layer 172 and a contact conductive layer 174, and the through-via 175 have the same structure as the contact plug 170.

Next, referring to FIG. 2A, according to embodiments, interconnection lines 180 connected to the contact plugs 170 and an upper end of the through-via 175 are formed to fabricate a semiconductor device 100.

Figure 13:
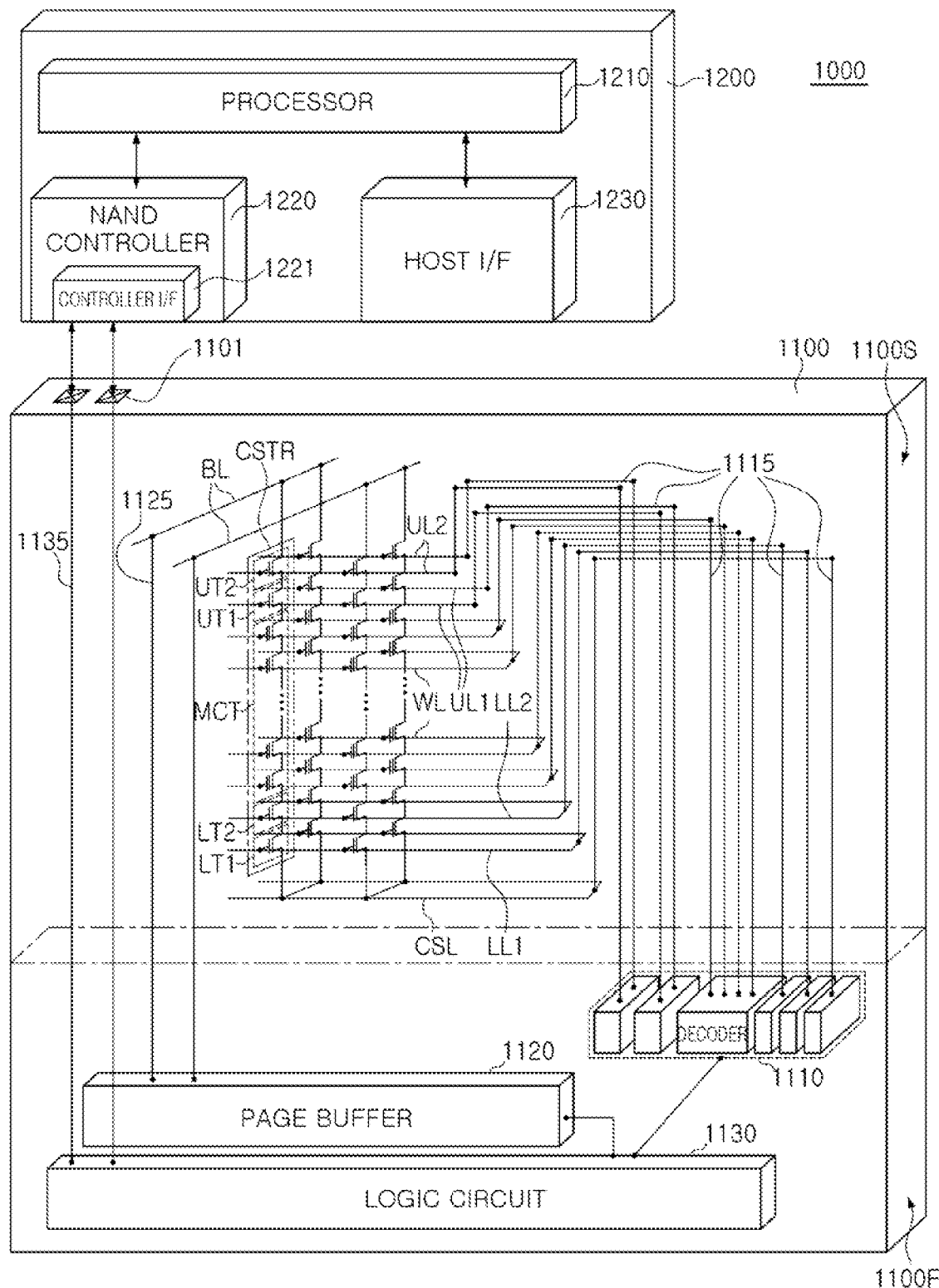
FIG. 13 is a schematic view of a data storage system that includes a semiconductor device according to embodiments.

FIG. 13 is a schematic view of a data storage system that includes a semiconductor device according to embodiments.

Referring to FIG. 13, according to embodiments, a data storage system 1000 includes a semiconductor device 1100 and a controller 1200 electrically connected to the semiconductor device 1100. The data storage system 1000 may be a storage device that includes one or more semiconductor devices 1100, or an electronic device that includes a storage device. For example, the data storage system 1000 may be a solid state drive device (SSD) device that includes one or more semiconductor devices 1100, a universal serial bus (USB), a computing system, a medical device, or a communications device.

According to embodiments, the semiconductor device 1100 is or includes a nonvolatile memory device and is, for example, a NAND flash memory device described with reference to FIGS. 1 to 11. The semiconductor device 1100 includes a first structure 1100F and a second structure 1100S on the first structure 1100F. In embodiments, the first structure 1100F is or includes a peripheral circuit structure that includes a decoder circuit 1110, a page buffer 1120, and a logic circuit 1130. The second structure 1100S is a memory cell structure that includes a bit line BL, a common source line CSL, word lines WL, first and second upper gate lines UL1 and UL2, first and second lower gate lines LL1 and LL2, and memory cell strings CSTR between the bit line BL and the common source line CSL.

According to embodiments, in the second structure 1100S, each of the memory cell strings CSTR includes lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 varies according to embodiments.

In embodiments, the upper transistors UT1 and UT2 include a string select transistor, and the lower transistors LT1 and LT2 include a ground select transistor. The lower gate lines LL1 and LL2 are gate electrodes of the lower transistors LT1 and LT2, respectively. The word lines WL are gate electrodes of the memory cell transistors MCT, and the upper gate lines UL1 and UL2 are gate electrodes of the upper transistors UT1 and UT2, respectively.

In embodiments, the lower transistors LT1 and LT2 include a lower erase control transistor LT1 and a ground select transistor LT2 connected in series. The upper transistors UT1 and UT2 include a string select transistor UT1 and an upper erase control transistor UT2 connected in series. At least one of the lower erase control transistor LT1 and the upper erase control transistor UT1 is used in an erase operation in which data stored in memory cell transistors MCT is erased using a gate induced drain leakage (GIDL) current.

According to embodiments, the common source line CSL, the first and second lower gate lines LL1 and LL2, the word lines WL, and the first and second upper gate lines UL1 and UL2 are electrically connected to the decoder circuit 1110 through first connection wirings 1115 that extend to the second structure 1100S within the first structure 1100F. The bit lines BL are electrically connected to the page buffer 1120 through second connection wirings 1125 that extend to the second structure 1100S within the first structure 1100F.

According to embodiments, in the first structure 1100F, the decoder circuit 1110 and/or the page buffer 1120 execute a control operation for at least one memory cell transistor MCT of a plurality of memory cell transistors MCT. The decode circuit 1110 and the page buffer 1120 are controlled by the logic circuit 1130. The semiconductor device 1000 communicates with the controller 1200 through an input/output (I/O) pad 1101 electrically connected to the logic circuit 1130. The I/O pad 1101 is electrically connected to the logic circuit 1130 through an input/output (I/O) connection wiring 1135 that extends to the second structure 1100S within the first structure 1100F.

According to embodiments, the controller 1200 includes a processor 1210, a NAND controller 1220, and a host interface 1230. According to some embodiments, the data storage system 1000 includes a plurality of semiconductor devices 1100. In this case, the controller 1200 controls the plurality of semiconductor devices 1100.

According to embodiments, the processor 1210 controls an overall operation of the data storage system 1000, including the controller 1200. The processor 1210 operates based on predetermined firmware, and controls the NAND controller 1220 to access the semiconductor device 1100. The NAND controller 1220 includes a NAND interface 1221 that processes communications with the semiconductor device 1100. A control command that controls the semiconductor device 1100, data to be written to the memory cell transistors MCT of the semiconductor device 1100, data to be read from the memory cell transistors MCT of the semiconductor device 1100, etc., are transmitted through the NAND interface 1221. The host interface 1230 provides a communications function between the data storage system 1000 and an external host. When a control command is received from the external host through the host interface 1230, the processor 1210 controls the semiconductor device 1100 in response to the control command.

Figure 14:
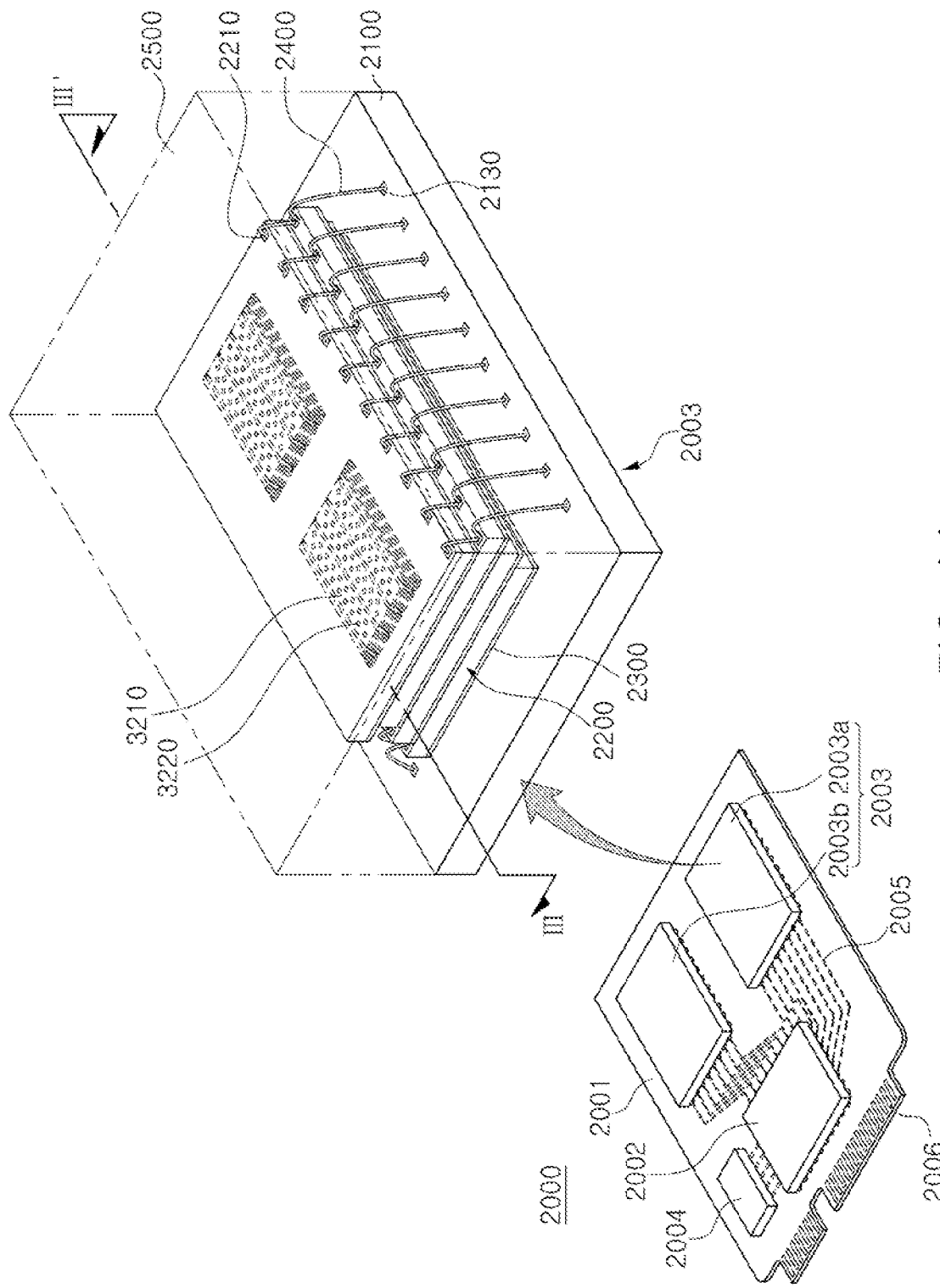
FIG. 14 is a schematic perspective view of a data storage system that includes a semiconductor device according to embodiments.

FIG. 14 is a perspective view of a data storage system that includes a semiconductor device according to embodiments.

Referring to FIG. 14, according to embodiments, a storage system 2000 according to some embodiments includes a main substrate 2001, a controller 2002 mounted on the main substrate 2001, one or more semiconductor packages 2003, and a DRAM 2004. The semiconductor package 2003 and the DRAM 2004 are connected to the controller 2002 through wiring patterns 2005 formed on the main substrate 2001.

According to embodiments, the main substrate 2001 includes a connector 2006 that includes a plurality of pins that couple to the external host. In the connector 2006, the number and disposition of the plurality of pins varies depending on a communications interface between the data storage system 2000 and the external host. In some embodiments, the data storage system 2000 communicates with the external host based on an interface, such as a universal serial bus (USB), a peripheral component interconnect express (PCI-Express), a serial advanced technology attachment (SATA), or an M-PHY for universal flash storage (UFS), etc. In embodiments, the data storage system 2000 operates with power supplied from the external host through at least one of the connectors 2006. The data storage system 2000 further includes a power management integrated circuit (PMIC) that divides the power received from the external host between the controller 2002 and the semiconductor package 2003.

According to embodiments, the controller 2002 writes data to the semiconductor package 2003 or reads data from the semiconductor package, and can increase the operating speed of the data storage system 2000.

According to embodiments, the DRAM 2004 is or includes a buffer memory that reduces a speed difference between the semiconductor package 2002, used as a data storage space, and the external host. The DRAM 2004 in the data storage system 2000 operates as a type of cache memory and provides a space for temporarily storing data during a control operation of the semiconductor package 2003. When the DRAM 2004 is included in the data storage system 2000, the controller 2002 further includes a DRAM controller that controls the DRAM 2004, in addition to a NAND controller that controls the semiconductor package 2003.

According to embodiments, the semiconductor package 2003 includes at least first and second semiconductor packages 2003a and 2003b that are spaced apart from each other. Each of the first and second semiconductor packages 2003a and 2203b includes a plurality of semiconductor chips 2200. Each of the first and second semiconductor packages 2003a and 2003b includes a package substrate 2100, semiconductor chips 2200 on the package substrate 2100, adhesive layers 2300 respectively disposed on lower surfaces of the semiconductor chips 2200, a connection structure 2400 that electrically connects the semiconductor chips 2200 to the package substrate 2100, and a molding layer 2500 that covers the semiconductor chips 2200 and the connection structure 2400 on the package substrate 2100.

According to embodiments, the package substrate 2100 is a printed circuit board (PCB) that includes upper package pads 2130. Each of the semiconductor chips 2200 includes an input/output (I/O) pad 2210. The I/O pad 2210 corresponds to the I/O pad 1101 of FIG. 14. Each of the semiconductor chips 2200 includes gate stack structures 3210 and channel structures 3220. Each of the semiconductor chips 2200 includes a semiconductor device described with reference to FIGS. 1 to 11.

In embodiments, the connection structure 2400 is a bonding wire that electrically connects the I/O pad 2210 to the upper package pads 2130. Accordingly, in each of the first and second semiconductor packages 2003a and 2003b, the semiconductor chips 2200 are electrically connected to each other by wire bonding, and are electrically connected to the upper package pads 2130 of the package substrate 2100. According to other embodiments, in each of the first and second semiconductor packages 2003a and 2003b, the semiconductor chips 2200 are electrically connected to each other by a connection structure that includes a through-silicon via (TSV) rather than the connection structure 2400 that uses wire bonding.

In embodiments, the controller 2002 and the semiconductor chips 2200 are included in a single package. In some embodiments, the controller 2002 and the semiconductor chips 2200 are mounted on an additional interposer substrate that differs from the main substrate 2001, and the controller 2002 and the semiconductor chips 2200 are connected to each other by a wiring formed on the interposer substrate.

Figure 15:
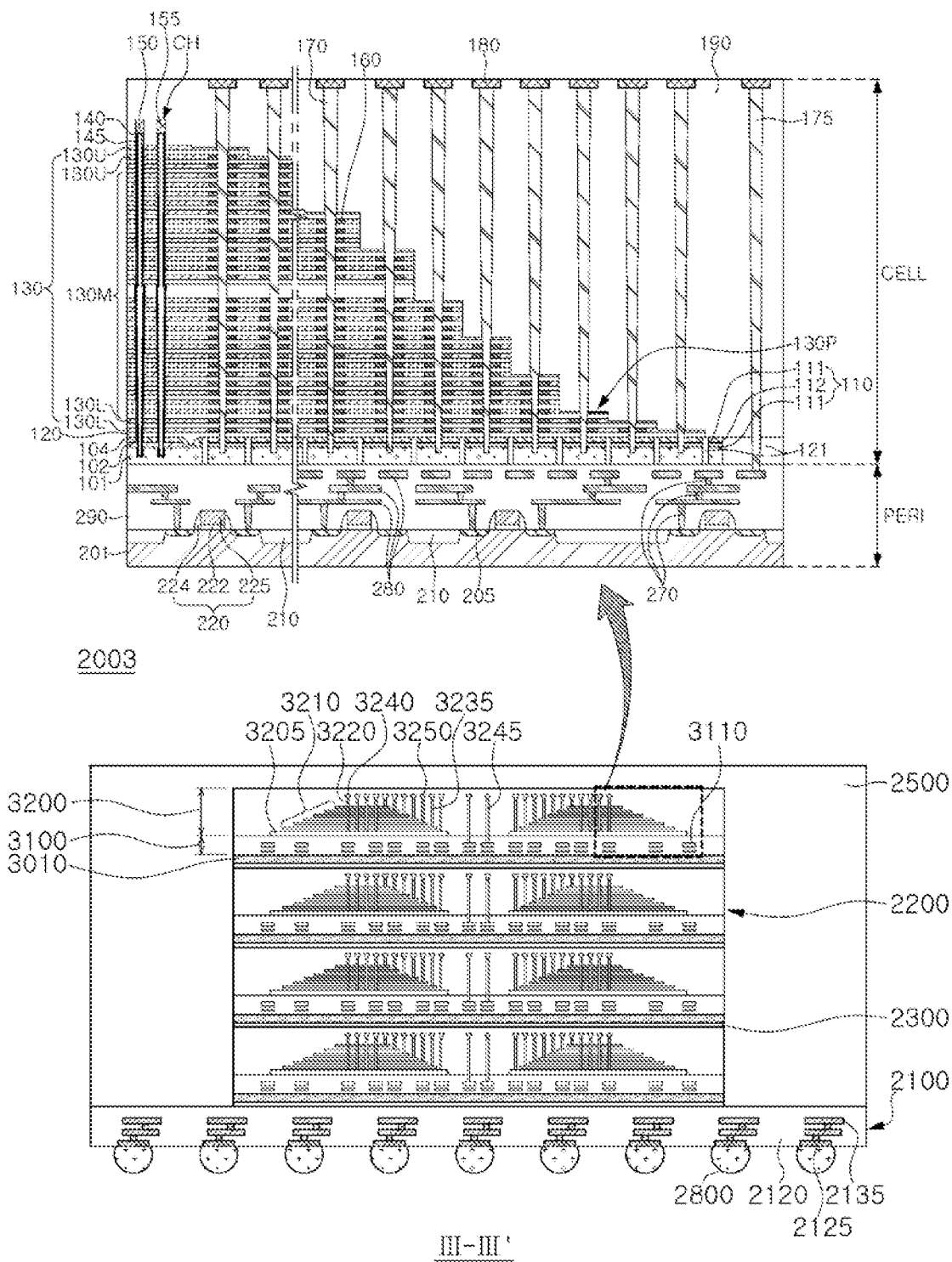
FIG. 15 a schematic cross-sectional view of a semiconductor package according to embodiments.

FIG. 15 is a schematic cross-sectional view of a semiconductor package according to embodiments. FIG. 15 illustrates an embodiment of a semiconductor package 2003 of FIG. 14, and conceptually illustrates a region cut along line III-III' of the semiconductor package 2003 of FIG. 14.

Referring to FIG. 15, in a semiconductor package 2003 according to embodiments, a package substrate 2100 is a printed circuit board (PCB). The package substrate 2100 includes a package substrate body portion 2120, upper package pads 2130 (see FIG. 14) disposed on an upper surface of the package substrate body portion 2120, lower pads 2125 disposed on a lower surface of the package substrate body portion 2120 or exposed through the lower surface of the package substrate body portion 2120, and internal wirings 2135 that electrically connect the upper package pads 2130 to the lower pads 2125 inside the package substrate body portion 2120. The upper package pads 2130 are electrically connected to the connection structures 2400. The lower pads 2125 are connected to wiring patterns 2005 of the main substrate 2010 of the data storage system 2000, as illustrated in FIG. 14, through conductive connection portions 2800.

According to embodiments, each of the semiconductor chips 2200 includes a semiconductor substrate 3010, and a first structure 3100 and a second structure 3200 sequentially stacked on the semiconductor substrate 3010. The first structure 3100 is a peripheral circuit region that includes peripheral wirings 3110. The second structure 3200 includes a common source line 3205, a gate stack structure 3210 on the common source line 3205, channel structures 3220 that penetrate through the gate stacking structure 3210, bit lines 3240 electrically connected to the memory channel structures 3220, and gate contact plugs 3235 and interconnection lines 3250 electrically connected to word lines WL (see FIG. 13) of the gate stack structure 3210. As described above with reference to FIGS. 1 to 11, in each of the semiconductor chips 2200, contact plugs 3235 are connected to end portions of the word lines WL that have decreased thicknesses and extend inwardly from a substrate of the second structure 3200 through the gate stack structure 3210.

According to embodiments, each of the semiconductor chips 2200 includes a through-interconnection 3245 electrically connected to peripheral wirings 3110 and that extends inwardly from the second structure 3200. The through-interconnection 3245 is disposed on an external side of the gate stack structure 3210, and penetrates through the gate stack structure 3210. Each of the semiconductor chips 2200 further includes an input/output (I/O) pad 2210 (see FIG. 14) electrically connected to the peripheral wirings 3110 of the first structure 3100.

As described above, a contact plug is disposed that penetrates through a pad region that has physical properties and/or a thickness that differ from those of a gate electrode, and are formed together with a through-via of a through-interconnection region. Thus, a semiconductor device that has improved reliability and productivity and a data storage system that includes the same can be provided.

While embodiments have been shown and described above, it will be apparent to those of ordinary skill in the art that modifications and variations could be made without departing from the scope of embodiments of the inventive concept as defined by the appended claims.

What is claimed is:

1. A semiconductor device, comprising:
a first structure that includes a first substrate and circuit elements on the first substrate; and
a second structure disposed on the first structure, wherein the second structure comprises:
a second substrate that includes a first region and a second region;
gate electrodes spaced apart from each other and stacked on the first region in a first direction, wherein the gate electrodes extend by different lengths in a second direction on the second region, and respectively include a pad region having an upper surface that is exposed upwardly in the second region;
interlayer insulating layers alternately stacked with the gate electrodes;
channel structures that extend in the first direction, penetrate through the gate electrodes, and that respectively include a channel layer;
contact plugs that extend in the first direction toward the second substrate and respectively penetrate through the pad region; and
plug insulating layers alternately disposed below the pad region with the interlayer insulating layers wherein the plug insulating layers surround each of the contact plugs, and
wherein each of the gate electrodes has a decreased thickness in the pad region,
wherein at least one of the contact plugs has a bent portion formed along an upper surface of the pad region or formed in the pad region wherein the bent portion has a discontinuously changed width.

2. The semiconductor device of claim 1, wherein, in at least one of the plug insulating layers, a first length between a first end portion in the second direction and the contact plugs that penetrate through the plug insulating layer differs from a second length between a second end portion in the second direction and the contact plugs that penetrate through the plug insulating layer.

3. The semiconductor device of claim 2, wherein the second structure further includes a pad insulating layer in contact with the pad region and the contact plug.

4. The semiconductor device of claim 1, wherein each of the gate electrodes has a first thickness in a region other than the pad region, and has a second thickness less than the first thickness in the pad region, and
the second thickness ranges from about 50% to about 80% of the first thickness.

5. The semiconductor device of claim 1, wherein, in each of the gate electrodes, the pad region has physical properties that differ from physical properties of a region other than the pad region.

6. The semiconductor device of claim 1, wherein lower ends of the contact plugs are disposed in the second substrate.

7. The semiconductor device of claim 1, wherein the contact plugs penetrate through the second substrate and extend into the first structure.

8. The semiconductor device of claim 1, wherein the second substrate includes a plurality of regions that are spaced apart from each other and that respectively surround each of the contact plugs.

9. The semiconductor device of claim 1, wherein the second structure further includes a horizontal insulating layer disposed below the gate electrodes, and a horizontal conductive layer disposed on the horizontal insulating layer on a portion of the second substrate, and
wherein the contact plugs penetrate through the horizontal insulating layer and the horizontal conductive layer.

10. The semiconductor device of claim 1, wherein the second structure further includes a horizontal conductive layer disposed below the gate electrodes and in contact with the second substrate, and
wherein the contact plugs penetrate through the horizontal conductive layer.

11. The semiconductor device of claim 1, further comprising:

a dummy pillar structure disposed in the second region around the contact plugs.

12. The semiconductor device of claim 11, wherein the dummy pillar structure comprises:
   a vertical extension portion that extends in the first direction to the second substrate; and
   a horizontal extension portion that surrounds the vertical extension portion and is alternately disposed with the interlayer insulating layers.

13. The semiconductor device of claim 1, wherein the second structure further comprises:
   a cell insulating layer that covers the gate electrodes; and
   a through-via disposed in an external region of the second substrate and that extends to the first structure through the cell insulating layer wherein the through-via includes a same material as the contact plugs.

14. A semiconductor device, comprising:
   a substrate that includes a first region and a second region;
   gate electrodes spaced apart from each other and stacked on the first region in a first direction, wherein the gate electrodes extend by different lengths in a second direction on the second region, and respectively include a pad region that has an upper surface in the second region that is upwardly exposed;
   interlayer insulating layers alternately stacked with the gate electrodes;
   channel structures that extend in the first direction and penetrate through the gate electrodes, wherein the channel structures respectively include a channel layer;
   plug insulating layers alternately disposed with the interlayer insulating layers and parallel to the gate electrodes below the pad region; and
   contact plugs that extend in the first direction and respectively penetrate through the pad region and the plug insulating layers below the pad region, wherein the contact plugs include lower ends disposed in the substrate,
   wherein, in each of the gate electrodes, the pad region has physical properties that differ from physical properties of a region other than the pad region.

15. The semiconductor device of claim 14, further comprising:
   a substrate insulating layer disposed through the substrate wherein the substrate insulating layer separates the substrate between contact plugs connected to different gate electrodes.

16. The semiconductor device of claim 14, wherein at least one of the contact plugs has a bent portion in a region adjacent to the pad region wherein the bent portion has a discontinuously changed width.

17. The semiconductor device of claim 14, wherein each of the gate electrodes has a decreased thickness in the pad region.

18. A data storage system, comprising:
   a semiconductor storage device that includes
      a first substrate;
      circuit elements on the first substrate;
      a second substrate disposed above the circuit elements and that includes a first region and a second region;
      gate electrodes spaced apart from each other and stacked on the first region in a first direction, wherein the gate electrodes extend by different lengths in a second direction on the second region, and respectively include a pad region that has an upper surface in the second region that is upwardly exposed;
      interlayer insulating layers alternately stacked with the gate electrodes;
      channel structures that extend in the first direction and penetrate through the gate electrodes, wherein the channel structures respectively include a channel layer;
      contact plugs that extend in the first direction toward the second substrate and respectively penetrate through the pad region;
      plug insulating layers alternately disposed with the interlayer insulating layers below the pad region and that surround each of the contact plugs; and
      an input/output pad electrically connected to the circuit elements; and
   a controller that is electrically connected to the semiconductor storage device through the input/output pad and that controls the semiconductor storage device,
   wherein each of the gate electrodes in the semiconductor storage device has a decreased thickness in the pad region,
   wherein the contact plugs penetrate through the second substrate.

* * * * *